United States Patent
Hamano et al.

(12) 
(10) Patent No.: US 10,582,129 B2
(45) Date of Patent: Mar. 3, 2020

(54) IMAGE PROCESSING APPARATUS, IMAGE PROCESSING METHOD, PROGRAM, AND STORAGE MEDIUM

(71) Applicant: CANON KABUSHIKI KAISHA, Tokyo (JP)

(72) Inventors: Hideyuki Hamano, Kawasaki (JP); Akihiko Kanda, Kawasaki (JP); Yoshihito Tamaki, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 12 days.

(21) Appl. No.: 15/850,102

(22) Filed: Dec. 21, 2017

(65) Prior Publication Data

US 2018/0184013 A1 Jun. 28, 2018

(30) Foreign Application Priority Data

Dec. 27, 2016 (JP) ................ 2016-252688

(51) Int. Cl.
| | |
|---|---|
| *H04N 5/232* | (2006.01) |
| *H04N 5/265* | (2006.01) |
| *G06T 7/70* | (2017.01) |
| *H04N 5/225* | (2006.01) |
| *G06T 7/593* | (2017.01) |
| *H04N 5/357* | (2011.01) |
| *H01L 27/146* | (2006.01) |

(52) U.S. Cl.
CPC ......... *H04N 5/23293* (2013.01); *G06T 7/593* (2017.01); *G06T 7/70* (2017.01); *H01L 27/146* (2013.01); *H01L 27/14643* (2013.01); *H04N 5/225* (2013.01); *H04N 5/232* (2013.01); *H04N 5/23212* (2013.01); *H04N 5/23229* (2013.01); *H04N 5/23296* (2013.01); *H04N 5/232122* (2018.08); *H04N 5/265* (2013.01); *H04N 5/3572* (2013.01); *H01L 27/14603* (2013.01)

(58) Field of Classification Search
CPC .... H04N 5/235; H04N 5/225; H04N 5/23212; H04N 5/232122; H04N 5/23293; H04N 5/232939
See application file for complete search history.

(56) References Cited

U.S. PATENT DOCUMENTS

| | | | |
|---|---|---|---|
| 4,410,804 A | 10/1983 | Stauffer | |
| 2003/0117511 A1* | 6/2003 | Belz ..................... | H04N 1/0044 348/333.11 |
| 2013/0314500 A1* | 11/2013 | Aoki .................... | H04N 13/296 348/46 |

FOREIGN PATENT DOCUMENTS

| | | |
|---|---|---|
| EP | 1 085 751 B1 | 11/2012 |
| JP | 2001-083407 A | 3/2001 |

\* cited by examiner

*Primary Examiner* — Nelson D. Hernández Hernádez
(74) *Attorney, Agent, or Firm* — Cowan, Liebowitz & Latman, P.C.

(57) ABSTRACT

An image processing apparatus is provided that includes an acquisition unit configured to acquire a plurality of viewpoint images having different viewpoint; a calculation unit configured to calculate associated information associated with parallax from the plurality of viewpoint images; an image processing unit configured to generate an output image by performing an image process on image data based on the plurality of viewpoint images; a setting unit configured to set the image process using the image processing unit; and a determination unit configured to acquire the associated information, determine an effect of the image process for each area in the output image, and output the determination result.

16 Claims, 18 Drawing Sheets

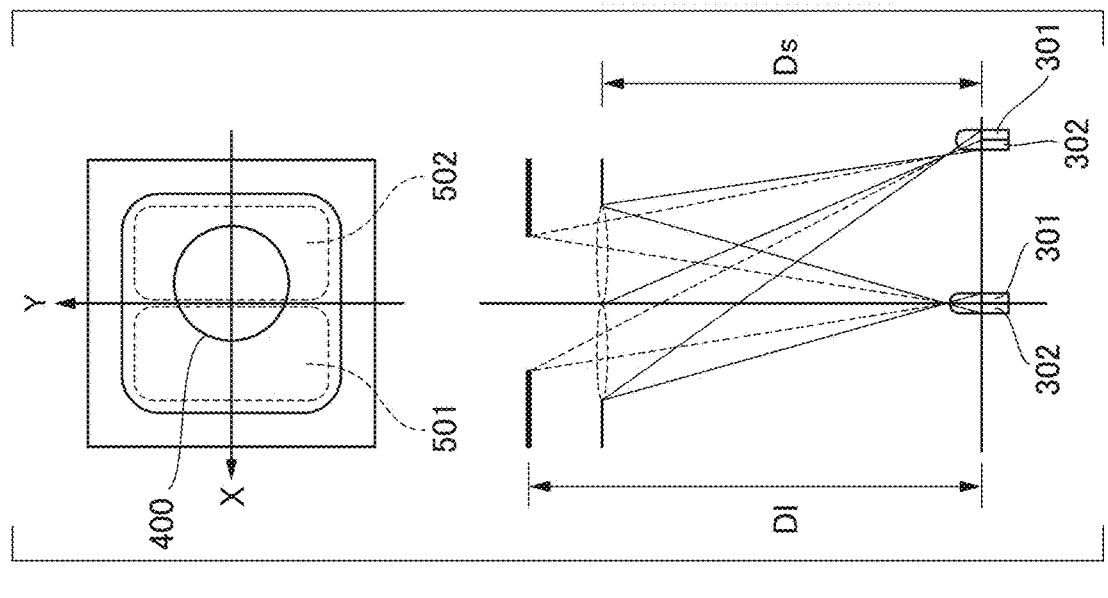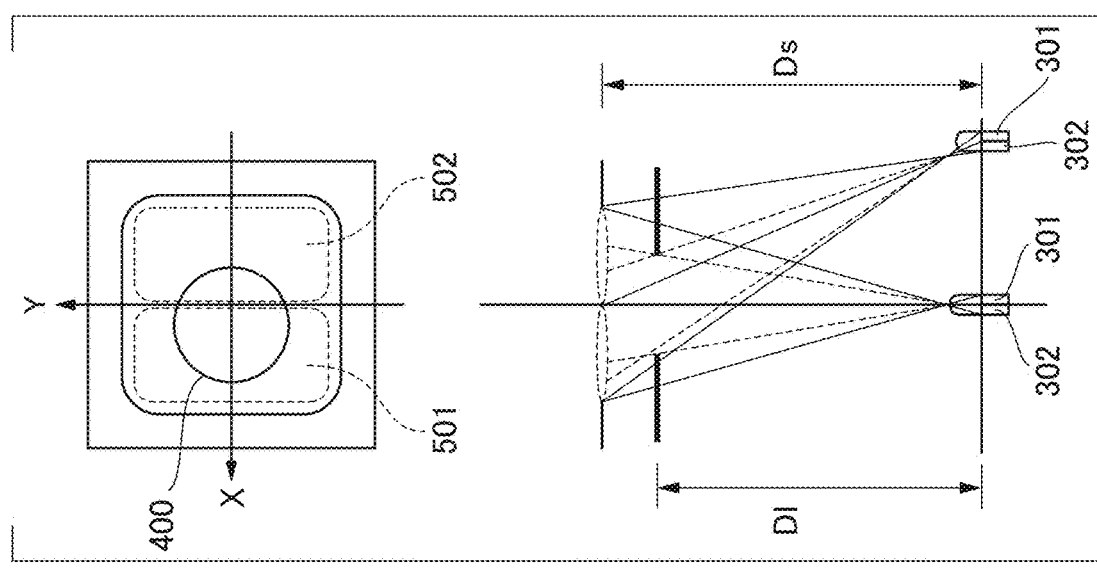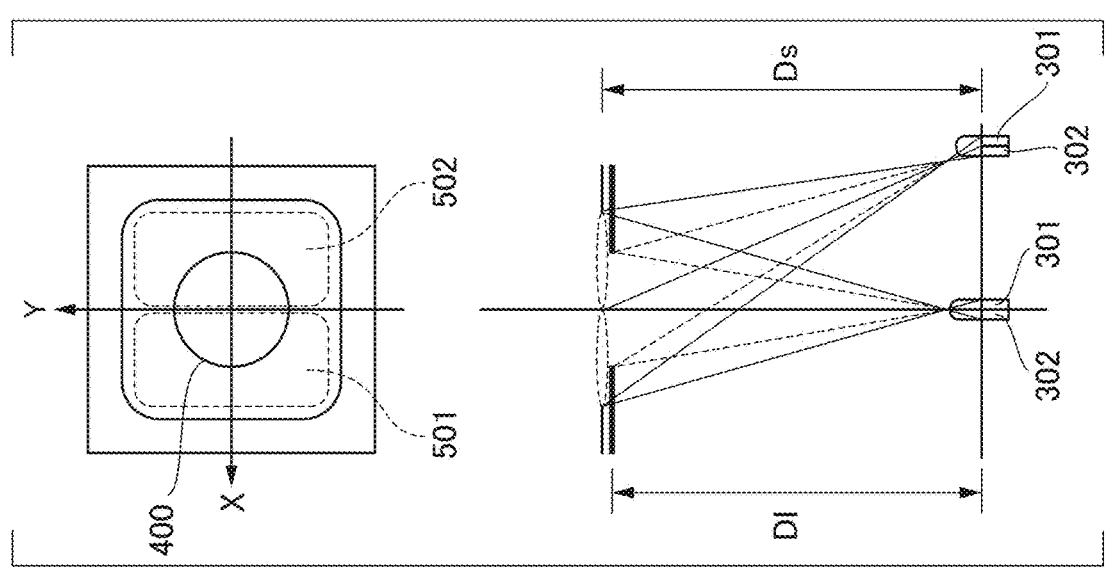

IMAGE PROCESSING APPARATUS, IMAGE PROCESSING METHOD, PROGRAM, AND STORAGE MEDIUM

FIELD OF THE INVENTION

The present invention relates to image processing technology using a viewpoint image.

DESCRIPTION OF THE RELATED ART

Imaging surface phase difference methods are focus detection methods for detecting phase differences between a plurality of signals acquired using focus detection pixels of an imaging element. In a two-dimensional imaging element included in an imaging apparatus disclosed in the specification of U.S. Pat. No. 4,410,804, one microlens and a photoelectric conversion unit which is divided into a plurality of parts are formed for one pixel. The photoelectric conversion unit which is divided into the plurality of parts receives light of different areas of an exit pupil of a photographing lens via the one microlens and is subjected to pupil division. Focus detection of a phase difference type is performed by generating image signals (viewpoint image signals) with different viewpoint from signals of light received by a plurality of photoelectric conversion units, calculating an amount of image shift from parallax between the viewpoint image signals, and converting the calculated amount of image shift into defocus amount information, Japanese Patent Laid-Open No. 2001-083407 includes generating an imaging signal by adding a plurality of viewpoint image signals using a photoelectric conversion unit which is divided into a plurality of parts.

When photographing is performed using a camera, a user focuses on a desired main object and shades the foreground and background of the main object greatly using a photographic formula which makes the main object stand out effectively. An image of an object area in the vicinity of an in-focus state is clarified depending on a photographing scene and the image is compared with the shaded foreground or background so that an image processing effect which makes the object image stand out can be obtained. It is desirable that the user be able to adjust an image processing effect after photographing.

On the other hand, when the user confirms the above image processing effect, techniques for presenting a degree of image processing effect to the user are important. For example, it can be difficult to confirm an image processing effect due to a screen size or resolution of a display device, or environmental conditions such as ambient brightness and the like. Thus, in order to facilitate the confirmation of an image processing effect, there is a method of enlarging and displaying an image on a display screen. However, there are cases in which it is difficult to select an area with a large effect as an enlarged area or in which it is difficult for the user to visually recognize a difference in effect when the settings in an image process are changed. Furthermore, even when the user selects an area in an image temporarily when it is difficult to select an area corresponding to the setting change in the image process, it is difficult to understand how to change the settings for the purpose of performing an effective image process.

SUMMARY OF THE INVENTION

The present invention realizes an image processing apparatus and an image processing method which make it easier to recognize an area having a large effect in an image and select settings of an image process.

According to an aspect of the present invention, an image processing apparatus is provided that includes at least one processor executing computer executable instructions or at least one circuit which functions as: an acquisition unit configured to acquire a plurality of viewpoint images having different viewpoint; a calculation unit configured to calculate associated information associated with parallax from the plurality of viewpoint images; an image processing unit configured to generate an output image by performing an image process on image data based on the plurality of viewpoint images; a setting unit configured to set the image process using the image processing unit; and a determination unit configured to acquire the associated information, determine an effect of the image process for each area in the output image, and output the determination result.

According to an image processing apparatus of the present invention, an image processing apparatus and an image processing method which make it easier to recognize an area having a large effect in an image and select settings of an image process can be realized.

Further features of the present invention will become apparent from the following description of exemplary embodiments (with reference to the attached drawings).

BRIEF DESCRIPTION OF THE DRAWINGS

FIGS. 10A to 10C are diagrams illustrating shadings due to pupil shifts between a plurality of viewpoint images.

DESCRIPTION OF THE EMBODIMENTS

Hereinafter, exemplary embodiments of the present invention will be described in detail on the basis of the drawings. In the following embodiment, an example in which the present invention is applied to an image processing apparatus such as a digital camera will be described, but the present invention can be widely applied to an imaging apparatus, an information processing apparatus, an electronic apparatus, or the like configured to perform an image processing method according to the present invention.

Figure 1:
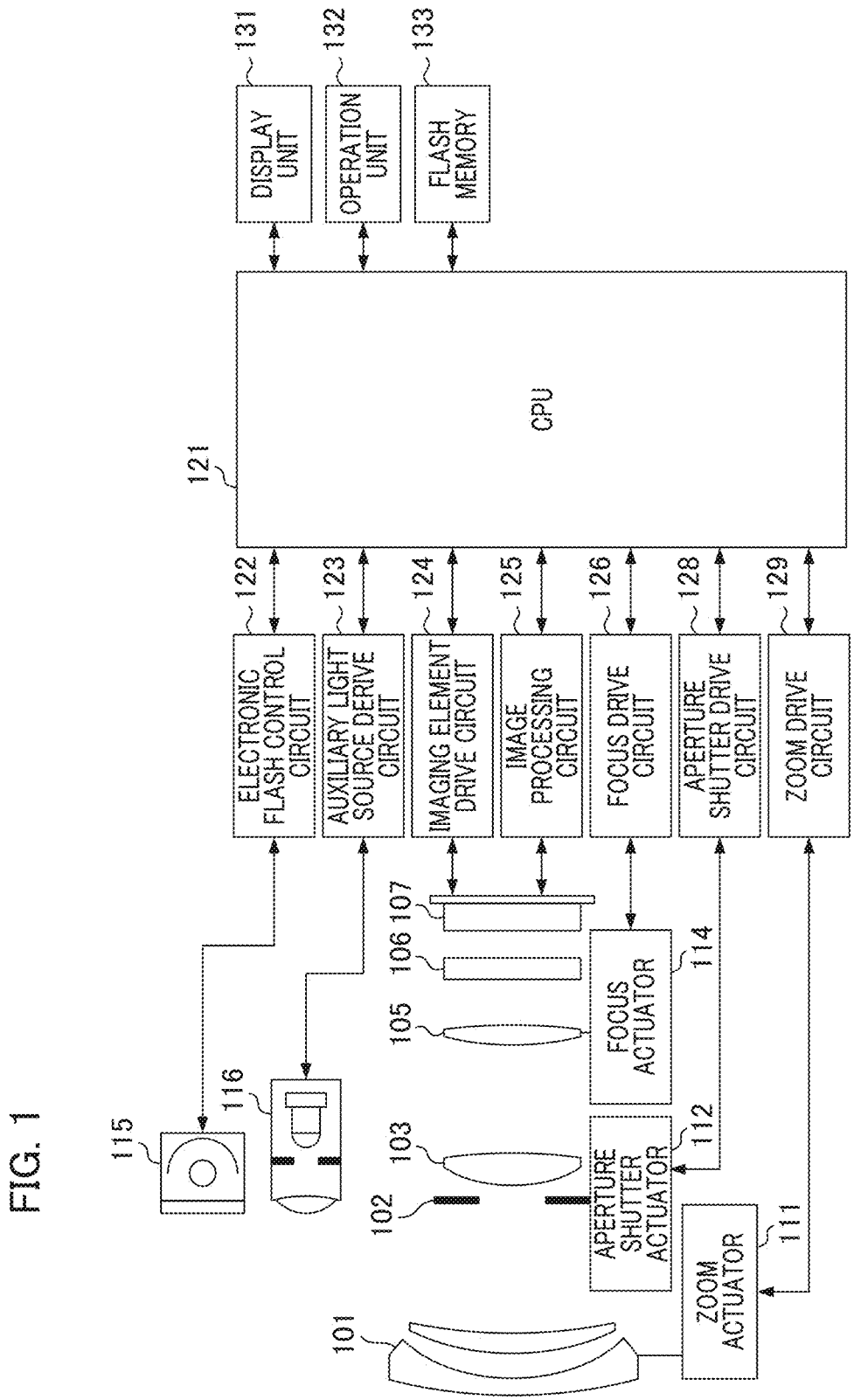
FIG. 1 is a schematic configuration diagram illustrating an image processing apparatus according to an embodiment.

The imaging apparatus to which the image processing apparatus according to an embodiment of the present invention is applied will be described below by way of example. FIG. 1 is a diagram illustrating an example of a configuration of the image processing apparatus including an imaging unit. In the embodiment, a digital camera capable of recording viewpoint image data will be described by way of example. Note that, in the following description, the same hardware can be realized as an object even when different functional blocks are described as operation objects.

A first lens group 101 is arranged at a distal end of an imaging optical system (an image-forming optical system) and is held by a lens barrel to be able to move forward and backward in an optical axis direction. An aperture and shutter 102 has a function of adjusting an amount of light at the time of photographing by adjusting its aperture diameter and being used as an exposure time adjustment shutter at the time of photographing a still image. A second lens group 103 moves forward and backward in the optical axis direction and is integrally formed with the aperture and shutter 102. The second lens group 103 has a zooming action (a zooming function) through interlocking with the forward and backward movements of the first lens group 101. A third lens group 105 is a focus lens configured to perform focus adjustment by moving forward and backward in the optical axis direction. An optical low-pass filter 106 is an optical element configured to reduce a false color or moiré for a photographed image. An imaging element 107 photoelectrically converts an optical image of the object formed through the imaging optical system and outputs an electrical signal. The imaging element 107 is constituted of, for example, a two-dimensional complementary metal oxide semiconductor (CMOS) photosensor and a peripheral circuit and is arranged on an imaging plane of the imaging optical system.

A zoom actuator 111 performs a zooming operation by rotating a cam barrel (not shown) and moving the first lens group 101 and the second lens group 103 in the optical axis direction. An aperture shutter actuator 112 adjusts an amount of photographing light by controlling an aperture diameter of the aperture and shutter 102 and performs exposure time control at the time of photographing a still image. A focus actuator 114 performs a focus adjustment operation by moving the third lens group 105 in the optical axis direction.

An object lighting electronic flash 115 is used at the time of photographing, and a flashing lighting device using a xenon tube or a lighting device including a light emitting diode (LED) configured to continuously emit light is used as the object lighting electronic flash 115. An autofocus (AF) auxiliary light source 116 projects an image of a mask with a predetermined aperture pattern onto the object field via a projection lens. Thus, focus detection capability for a low-luminance object or a low-contrast object is improved.

A central processing unit (CPU) 121 is a central unit configured to control the entire system and constitutes a control unit for a camera main body. The CPU 121 includes a calculation unit, a read only memory (ROM), a random access memory (RAM), an analog/digital (A/D) converter, a D/A converter, a communication interface circuit, and the like. The CPU 121 executes a series of operations such as AF control, an imaging process, an image process, and a recording process by driving various circuits in a camera in accordance with a predetermined program stored in the ROM.

An electronic flash control circuit 122 controls the lighting of an electronic flash 115 in synchronization with a photographing operation in accordance with a control command of the CPU 121. An auxiliary light source drive circuit 123 controls the lighting of the AF auxiliary light source 116 in synchronization with a focus detection operation in accordance with a control command of the CPU 121. An imaging element drive circuit 124 controls an imaging operation of the imaging element 107, performs A/D conversion on the acquired imaging signal, and transmits the A/D converted signal to the CPU 121. An image processing circuit 125 performs a process such as gamma conversion, color interpolation, and Joint Photographic Experts Group (JPEG) compression on an image acquired by the imaging element 107 in accordance with a control command of the CPU 121.

A focus drive circuit 126 performs focus adjustment by driving the focus actuator 114 on the basis of the focus detection result in accordance with a control command of the CPU 121 and moving the third lens group 105 in the optical axis direction. An aperture shutter drive circuit 128 controls the aperture diameter of the aperture and shutter 102 by driving the aperture shutter actuator 112 in accordance with a control command of the CPU 121. A zoom drive circuit 129 drives a zoom actuator 111 in response to a user's zoom operation instruction in accordance with a control command of the CPU 121.

A display unit 131 includes a display device such as a liquid crystal display device (LCD) and displays information on a photographing mode of the camera, a preview image before photographing and a confirmation image after photographing, an in-focus state display image at a time of focus detection, or the like on a screen. An operation unit 132 includes a power switch, a release (photographing trigger) switch, a zoom operation switch, a photographing mode selection switch, and the like as operation switches and outputs an operation instruction signal to the CPU 121. A flash memory 133 is a recording medium attachable to and detachable from the camera main body and records photographed image data or the like.

Figure 2A:
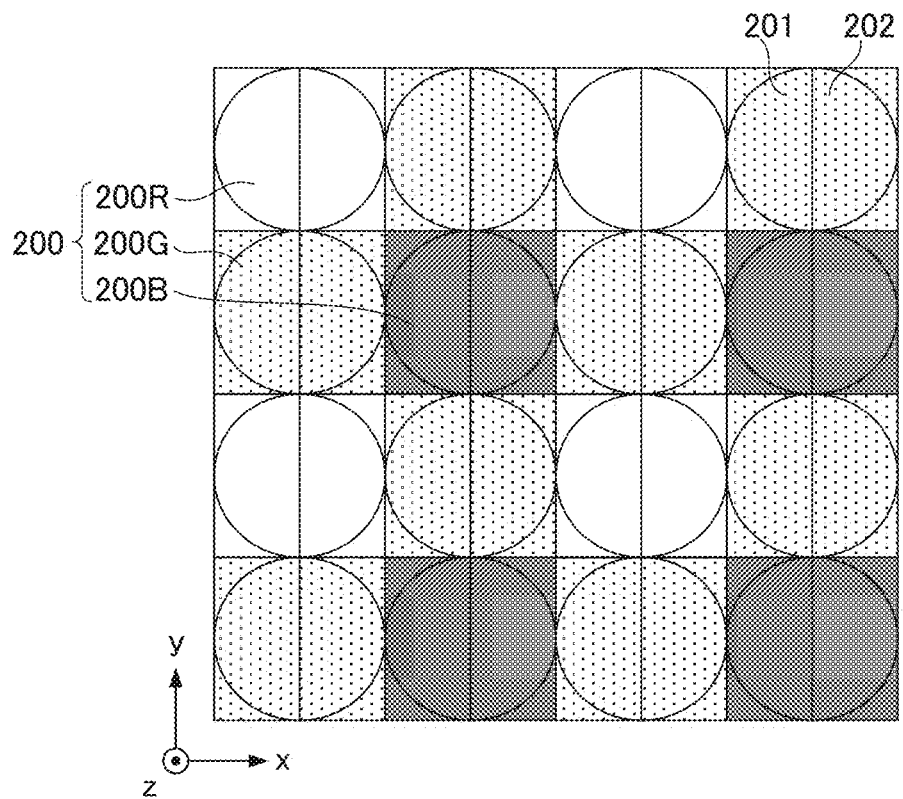
FIGS. 2A and 2B are schematic diagrams illustrating pixel arrays in the embodiment.
Figure 2B:
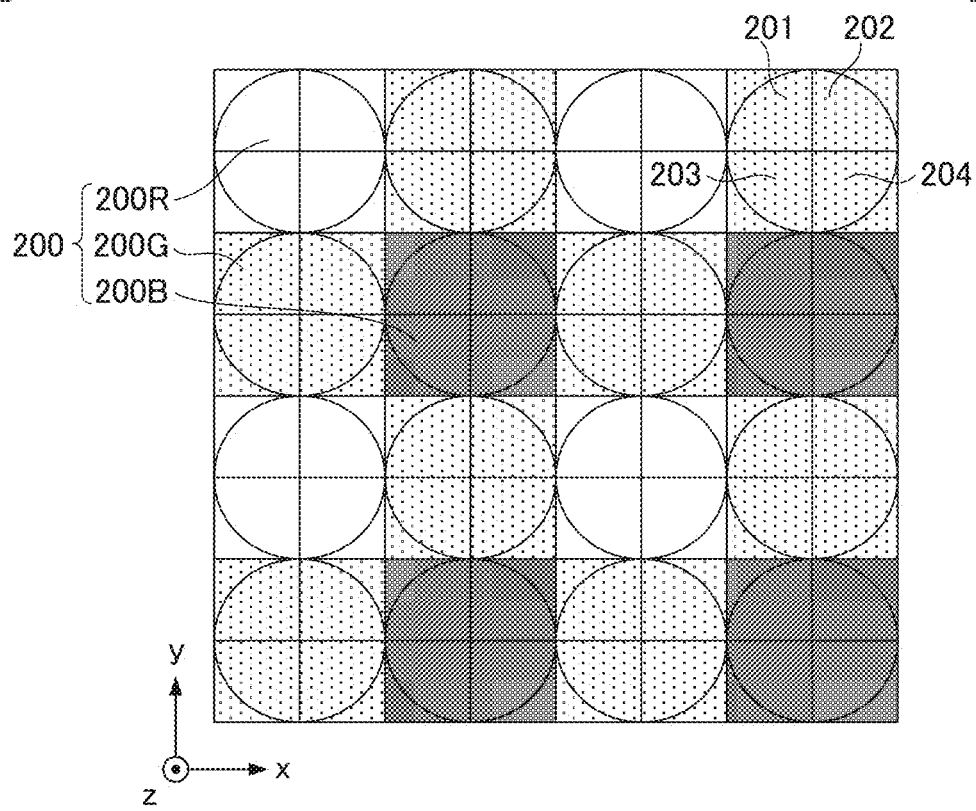

FIGS. 2A and 2B are schematic diagrams of pixel arrays of the imaging element 107 and illustrate pixel arrays of a two-dimensional CMOS image sensor. Directions which are perpendicular to the paper surface, a horizontal direction, and a vertical direction in FIGS. 2A and 2B are defined as a z direction, an x direction, and a y direction, respectively. An imaging pixel is illustrated in a range of four rows and four columns and a sub-pixel array is illustrated in a range of four rows and eight columns. A pixel group 200 with two rows and two columns illustrated in FIG. 2A is constituted of pixels 200R, 200G, and 200B. The pixels 200R with spectral sensitivity of R (red) are located on the upper left of FIGS. 2A and 2B, the pixels 200G with spectral sensitivity of G (green) are located on the upper right and the lower left, and the pixels 200B with spectral sensitivity of B (blue) are located on the lower right. In addition, each of the pixels is constituted of first sub-pixels 201 and second sub-pixels 202 arranged in one row and two columns. In other words, when the number of divisions in the x direction is expressed as Nx, the number of divisions in the y direction is expressed as Ny, and the number of divisions is expressed as $N_{LF}$, FIG. 2A illustrates an example in which Nx=2, Ny=1, and $N_{LF}$=Nx× Ny=2. The first sub-pixel 201 is constituted of a first photoelectric conversion unit corresponding to one microlens and the second sub-pixel 202 is constituted of a second photoelectric conversion unit corresponding to a corresponding microlens.

In an example illustrated in FIG. 2A, a captured image and a plurality of pupil-divided viewpoint images can be acquired by arranging a plurality of pixels in four columns× four rows (sub-pixels in eight columns×four rows) on a plane. A captured image is an image acquired from one pixel unit (a set of 200R, two 200Gs, and 200R). A plurality of viewpoint images are images with different viewpoint and have parallax with respect to each other. An input image used to generate a plurality of viewpoint images corresponding to the number of divisions $N_{LF}$ can be acquired by the imaging element 107.

Figure 3A:
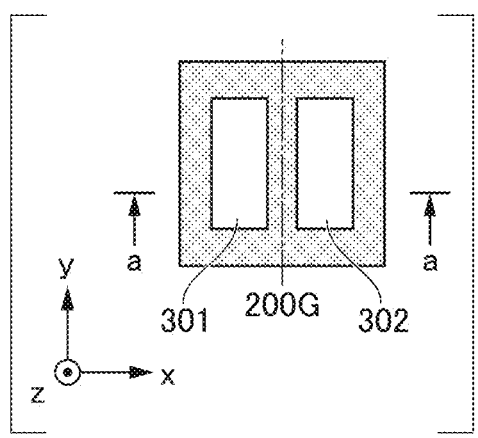
FIGS. 3A to 3D are schematic plan views and schematic cross-sectional views illustrating pixels in the embodiment.
Figure 3B:
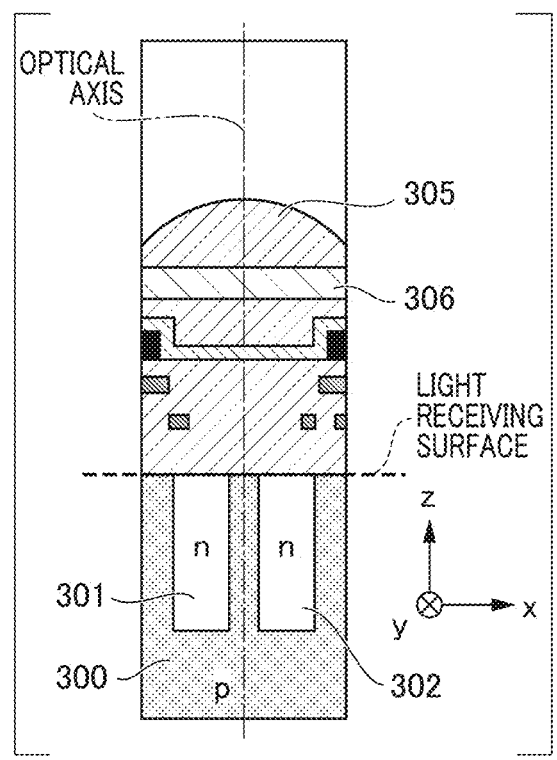

FIG. 3A illustrates a plan view of one pixel 200G in the imaging element 107 when viewed from a light receiving surface side (a+z direction) thereof. A direction which is perpendicular to the paper surface, a horizontal direction, and a vertical direction in FIG. 3A are defined as a z direction, an x direction, and a y direction, respectively. The perpendicular front side, the right direction, and the upper direction of the drawing are defined as a +z direction, a +x direction, and a +y direction, respectively. FIG. 3B is a cross-sectional view taken along a cutting line a-a in FIG. 3A when viewed from a −y side. A direction which is perpendicular to the paper surface, a horizontal direction, and a vertical direction in FIG. 3B are defined as a y direction, an x direction, and a z direction, respectively.

In the pixel 200G, a microlens 305 configured to condense incident light on a light receiving surface side of each of the pixels is formed. A color filter 306 is formed closer to the light receiving surface side than the microlens 305. The spectral transmittance of the color filter 306 may be changed for each pixel or for each photoelectric conversion unit and the color filter may be omitted as necessary.

The first photoelectric conversion unit 301 and the second photoelectric conversion unit 302 correspond to the first sub-pixel 201 and the second sub-pixel 202. The first photoelectric conversion unit 301 and the second photoelectric conversion unit 302 have a configuration of a pin structure photodiode in which an intrinsic layer is sandwiched between a p-type layer and an n-type layer or a pn junction photodiode in which an intrinsic layer is omitted.

After light incident on the pixel 200G is condensed through the microlens 305 and spectrally diffracted by the color filter 306, the first photoelectric conversion unit 301 and the second photoelectric conversion unit 302 receive the light. In the photoelectric conversion units 301 and 302, after electrons and holes are paired in accordance with an amount of received light and separated by a depletion layer, negatively charged electrons are accumulated in an n-type layer (not shown). On the other hand, holes are discharged to the outside of an imaging element through a p-type layer connected to a constant voltage source (not shown). Electrons accumulated in the n-type layer of the photoelectric conversion units 301 and 302 are transferred to an electrostatic capacitance unit (FD) via a transfer gate, converted into voltage signals, and output as pixel signals.

Figure 3C:
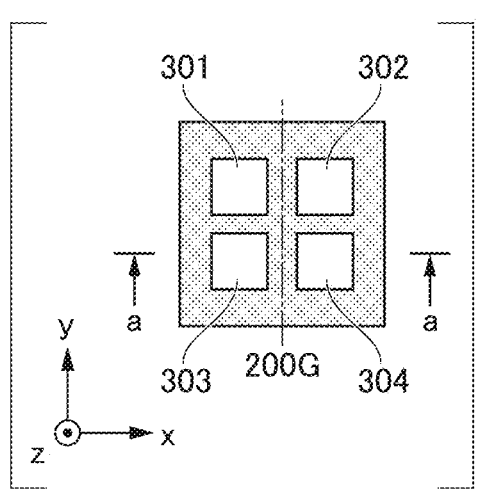
Figure 3D:
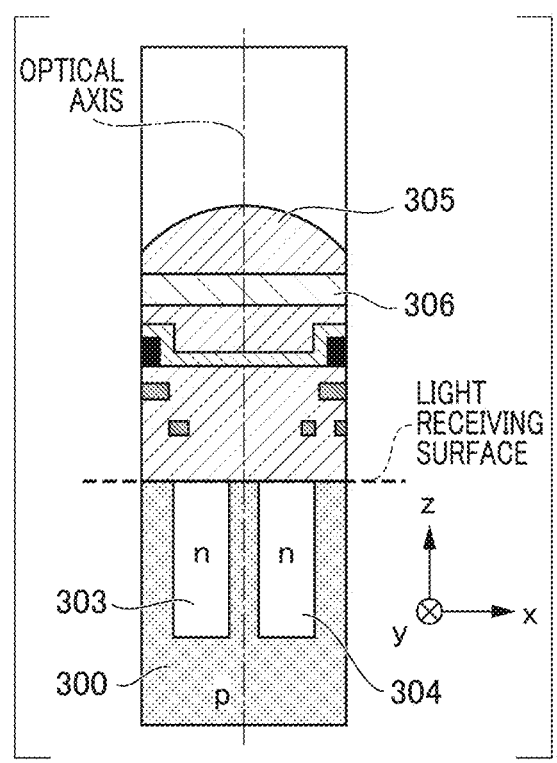

The number of divisions of a photoelectric conversion unit is not limited to 2. FIGS. 2B, 3C, and 3D illustrate an example of Nx=2, Ny=2, and $N_{LF}$=4, that is, the photoelectric conversion unit is divided into quarters. A plurality of viewpoint images can be acquired from an input image corresponding to a pixel array. In this case, pixel signals are output from the first to fourth photoelectric conversion unit 301 to 304 which are divided into quarters. The first to fourth photoelectric conversion unit 301 to 304 correspond to first to fourth pupil partial areas of the image-forming optical system. The pupil partial areas can generate a first viewpoint image to $N_{LF}{}^{th}$ viewpoint images with a predetermined resolution corresponding to a specific pupil partial area among first to $N_{LF}{}^{th}$ pupil partial areas which are partial areas constituting an exit pupil area of the image-forming optical system.

Figure 4:
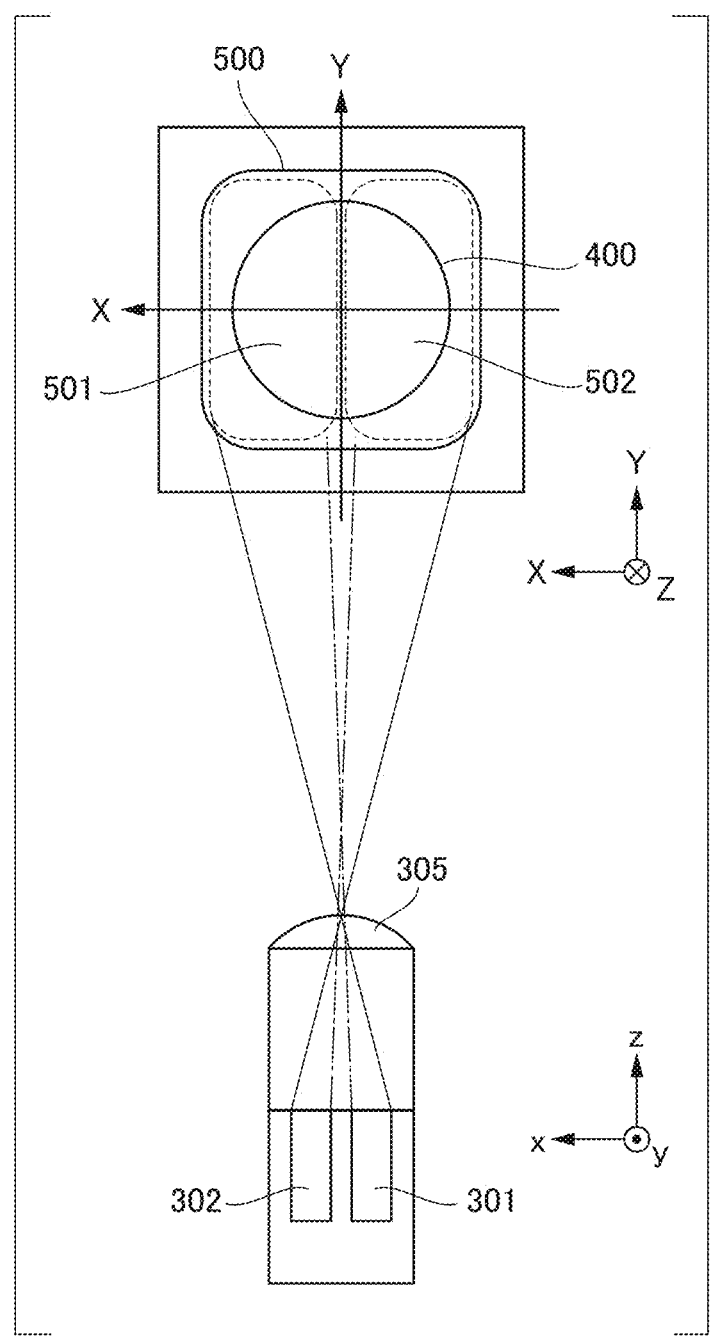
FIG. 4 is a schematic explanatory diagram illustrating a pixel and pupil division in the embodiment.

FIG. 4 is a schematic diagram for describing the correspondence between the pixel structures illustrated in FIGS. 3A and 3B and pupil division. The lower side of FIG. 4 illustrates a cross-sectional view of a cut surface along line a-a of a pixel structure viewed from a +y direction and the upper side thereof illustrates a diagram of an exit pupil plane (refer to an exit pupil 400) of the image-forming optical system, viewed from a −Z direction. A Z direction is an optical axis direction and an X direction and a Y direction are directions which are perpendicular to the Z direction. In FIG. 4, to correspond to the coordinate axes of the exit pupil plane, an x axis and a y axis of a cross-sectional view of a pixel structure are reversed from the states shown in FIGS. 3A to 3D. The imaging element is arranged near an imaging plane of a photographing lens (the image-forming optical system), and thus a luminous flux from the object passes through the exit pupil 400 of the image-forming optical system and is incident on pixels. A surface having the imaging element arranged therein is set as an imaging surface. FIG. 4 illustrates a first pupil partial area 501 and a second pupil partial area 502 which are bisected.

The first pupil partial area 501 has substantially a conjugate relationship with a light receiving surface of the first photoelectric conversion unit 301 in which the center of gravity is biased in a −x direction by the microlens 305. In other words, the first pupil partial area 501 represents a pupil area which can be received by the first photoelectric conversion unit 301 and the center of gravity is biased in the +X direction (left in FIG. 4) on the exit pupil plane. Furthermore, the second pupil partial area 502 has substantially a conjugate relationship with a light receiving surface of the second photoelectric conversion unit 302, the center of gravity of which is biased in the +x direction, by the microlens 305. The second pupil partial area 502 represents a pupil area which can be received by the second photoelectric conversion unit 302 and the center of gravity is biased in the −X direction (right in FIG. 4) on the exit pupil plane.

A pupil area 500 has substantially a conjugate relationship with a light receiving surface obtained by combining both of the first photoelectric conversion unit 301 and the second photoelectric conversion unit 302 and the microlens 305. This area is a pupil area which can be received by the entire pixel 200G obtained by combining the photoelectric conversion unit 301 and the photoelectric conversion unit 302.

Figure 5A:
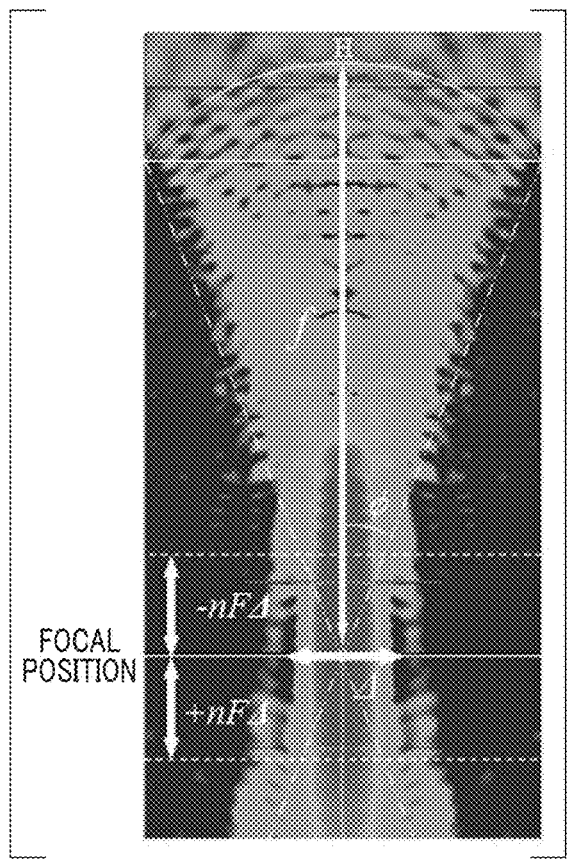
FIGS. 5A and 5B are diagrams illustrating an example of a light intensity distribution inside a pixel in the embodiment.
Figure 5B:
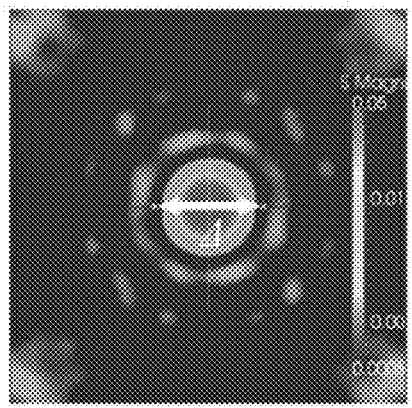

FIGS. 5A and 5B are diagrams illustrating an example of a light intensity distribution when light is incident on a microlens formed in each pixel. FIG. 5A illustrates a light intensity distribution in a cross section which is parallel to an optical axis of the microlens. FIG. 5B illustrates a light intensity distribution in a cross section which is perpendicular to the optical axis of the microlens at a focal position of the microlens. Incident light is condensed on a focal position by the microlens. However, a diameter of a focused spot cannot be made smaller than a diffraction limit A, which is a finite size due to the influence of diffraction due to the wave nature of light. A size of the light receiving surface of the photoelectric conversion unit is about 1 to 2 μm, whereas a focused spot of the microlens is about 1 μm. For this reason, the first pupil partial area 501 and the second pupil partial area 502 in FIG. 4 having a conjugation relationship with the light receiving surface of each photoelectric conversion unit via the microlens are not clearly pupil-divided due to diffraction blur and have a light reception rate distribution (a pupil intensity distribution) depending on an angle of incidence of light.

Figure 6:
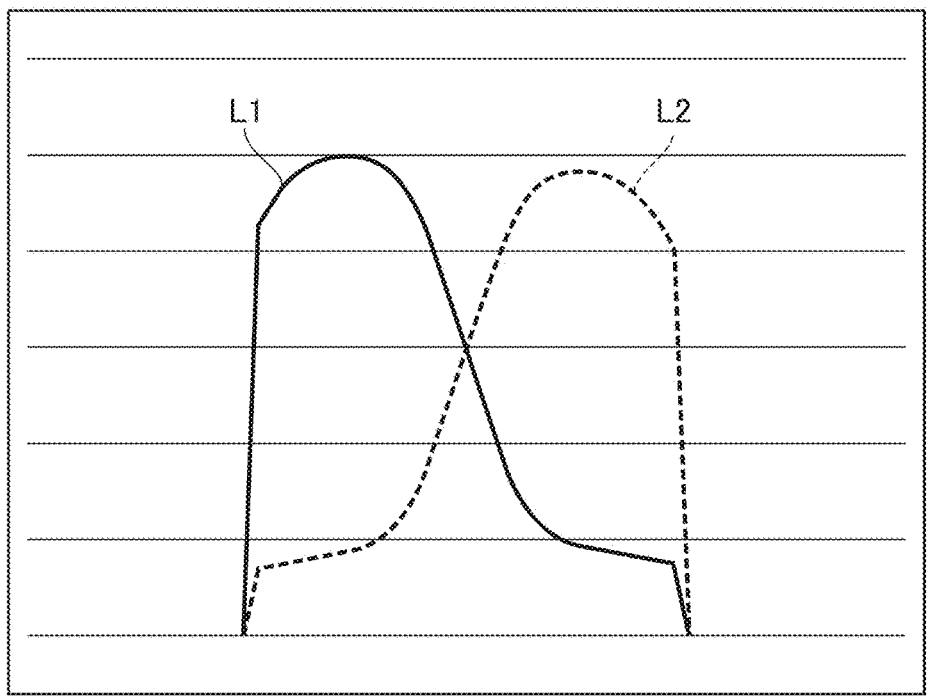
FIG. 6 is a diagram illustrating a pupil intensity distribution in the embodiment.

FIG. 6 illustrates an example of a light reception rate distribution (a pupil intensity distribution) depending on an angle of incidence of light. A horizontal axis represents pupil coordinates and a vertical axis represents a light reception rate. A graph line L1 indicated by a solid line in FIG. 6 represents a pupil intensity distribution along the X axis of the first pupil partial area 501 in FIG. 4. A light reception rate indicated by the graph line L1 rises sharply from the left end, reaches the peak, and gradually decreases, and then a rate of change becomes gentle until the right end. Furthermore, a graph line L2 indicated by a broken line in FIG. 6 represents a pupil intensity distribution along the X axis of the second pupil partial area 502. A light reception rate indicated by the graph line L2 rises sharply from the right end, reaches the peak, and gradually decreases, and then a rate of change becomes gentle until the left end opposite (bilaterally symmetrical) to the graph line L1. As shown in the drawing, pupil division is gently performed.

Figure 7:
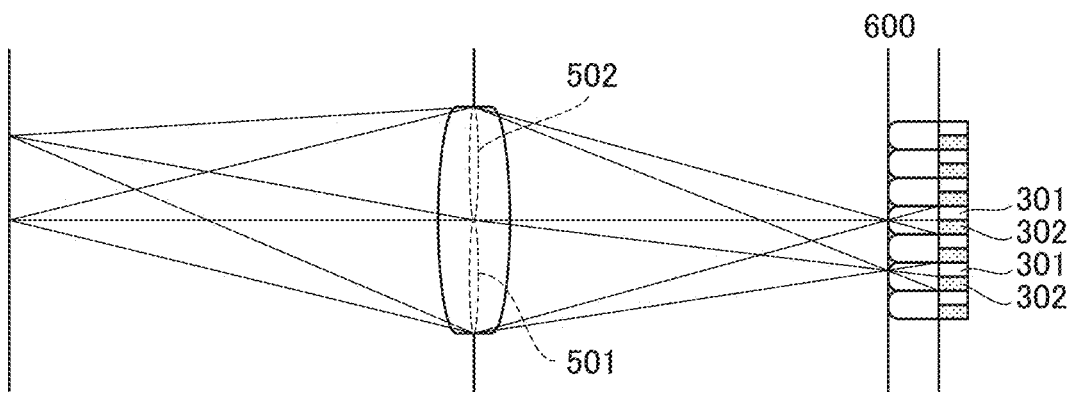
FIG. 7 is a schematic explanatory diagram illustrating an imaging element and pupil division in the embodiment.

FIG. 7 is a schematic diagram illustrating a correspondence between an imaging element and pupil division. The first photoelectric conversion unit 301 and the second photoelectric conversion unit 302 correspond to the first sub-pixel 201 and the second sub-pixel 202, and each pixel of the imaging element receives a luminous flux passing through the first pupil partial area 501 and the second pupil partial area 502. Light field data (hereinafter referred to as "LF data") indicating a spatial distribution and an angular distribution of a light intensity is acquired from a signal received by each sub-pixel as input image data. A viewpoint image can be generated for each different pupil partial area of the image-forming optical system by selecting an output signal of a specific photoelectric conversion unit for each pixel from the LF data. For example, a viewpoint image (hereinafter referred to as a "first viewpoint image") with a predetermined resolution corresponding to the first pupil partial area 501 of the image-forming optical system can be generated by selecting a signal of the first sub-pixel 201 for each pixel. On the other hand, a viewpoint image (hereinafter referred to as a "second viewpoint image") with a predetermined resolution corresponding to the second pupil partial area 502 of the image-forming optical system can be generated by selecting a signal of the second sub-pixel 202 for each pixel. Furthermore, a captured image with a predetermined resolution can be generated by combining all output signals of the divided photoelectric conversion units for each pixel from the LF data.

As described the above, the imaging element according to the embodiment has a structure in which a plurality of pixel units each including a plurality of photoelectric conversion units configured to receive luminous fluxes passing through different pupil partial areas of the image-forming optical system are arranged and can acquire LF data.

Figure 8:
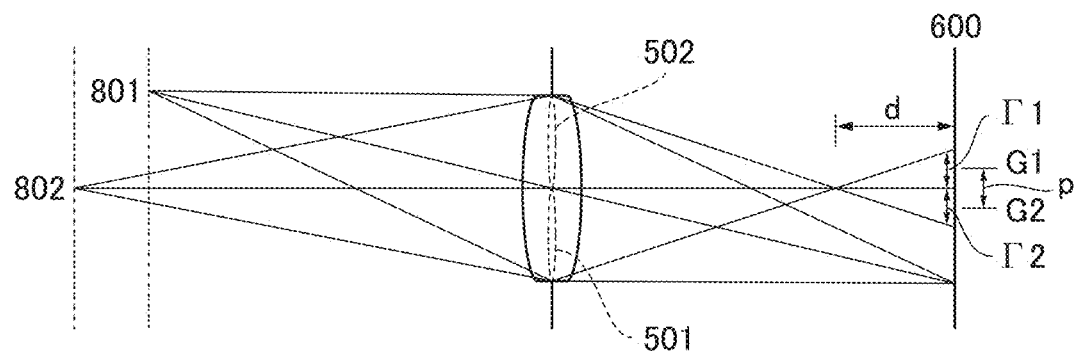
FIG. 8 is a schematic diagram illustrating a relationship between amounts of defocus amount of a plurality of viewpoint images and an amount of image shift.

A relationship between amounts of defocus and an amount of image shift of a first viewpoint image and a second viewpoint image generated from LF data acquired by the imaging element will be described with reference to FIG. 8. FIG. 8 illustrates a schematic relationship diagram between the amounts of defocus of the first viewpoint image and the second viewpoint image and the amount of image shift between the first viewpoint image and the second viewpoint image. It is assumed that an imaging element is arranged in an imaging surface 600 and the exit pupil of the image-forming optical system is bisected into the first pupil partial area 501 and the second pupil partial area 502 like in FIGS. 4 and 7.

In an amount of defocus d in FIG. 8, a magnitude |d| represents a distance from an imaged position of the object image to the imaging surface 600. It is defined that directions are set to a negative sign (d<0) in a front in-focus state in which the imaged position of the object image is closer to the object side than the imaging surface 600 and set to a positive sign (d>0) in a rear in-focus state opposite to the front in-focus state. In an in-focus state in which the imaged position of the object image is on an imaging surface (a focus position), d=0. A position of the object 801 illustrated in FIG. 8 represents a position corresponding to an in-focus state (d=0). A position of the object 802 represents a position corresponding to a front in-focus state (d<0) as an example. In the following description, the front in-focus state (d<0) and the rear in-focus state (d>0) are collectively referred to as a defocused state (|d|>0).

In the front in-focus state (d<0), a luminous flux passing through the first pupil partial area 501 (or the second pupil partial area 502) of a luminous flux from the object 802 is temporarily condensed and then spreads to have a width F1 (or F2) about a gravity center position G1 (or G2) of the luminous flux. In this case, a blurred image is formed on the imaging surface 600. The blurred image is received by the first sub-pixel 201 (or the second sub-pixel 202) constituting each pixel unit arranged in the imaging element and the first viewpoint image (or the second viewpoint image) is generated. Thus, the first viewpoint image (or the second viewpoint image) is stored as image data of the object image (a blurred image) with the width Γ1 (or Γ2) at the gravity center position G1 (or G2) on the imaging surface 600. The width Γ1 (or Γ2) of the object image increases roughly proportionally as the magnitude |d| of the amount of defocus d increases. Similarly, when an amount of image shift of the object image between the first viewpoint image and the second viewpoint image is expressed as "p," a magnitude |p| increases as a magnitude |d| of the amount of defocus d increases. For example, an amount of image shift p is defined as a difference "G1–G2" between the gravity center positions of luminous fluxes and a magnitude |p| increases roughly proportionally as |d| increases. Note that, in the rear in-focus state (d>0), an image shift direction of the object image between the first viewpoint image and the second viewpoint image is opposite to that of the front in-focus state, but there is a similar tendency.

Therefore, in the embodiment, a magnitude of an amount of image shift between the first viewpoint image and the second viewpoint image increases as the first viewpoint image and the second viewpoint image or an amount of defocus of a captured image obtained by adding the first viewpoint image and the second viewpoint image increases and decreases.

In the embodiment, a depth correction process of correcting a depth of the object in a captured image on the basis of an image shift amount distribution after photographing using a relationship between an amount of defocus and an amount of image shift of a plurality of viewpoint images (a first viewpoint image to an $N_{LF}^{th}$ viewpoint image) is performed. An image in which a depth of a object area in the vicinity of focus is corrected on the basis of an image shift amount distribution after the photographing from LF data acquired by the imaging element is referred to as a depth correction image.

An image processing method of generating a depth correction image will be described with reference to a flowchart in FIG. 9. The process in FIG. 9 is performed using the CPU 121 and the image processing circuit 125.

[Multi-Viewpoint Image and Captured Image]

Figure 9:
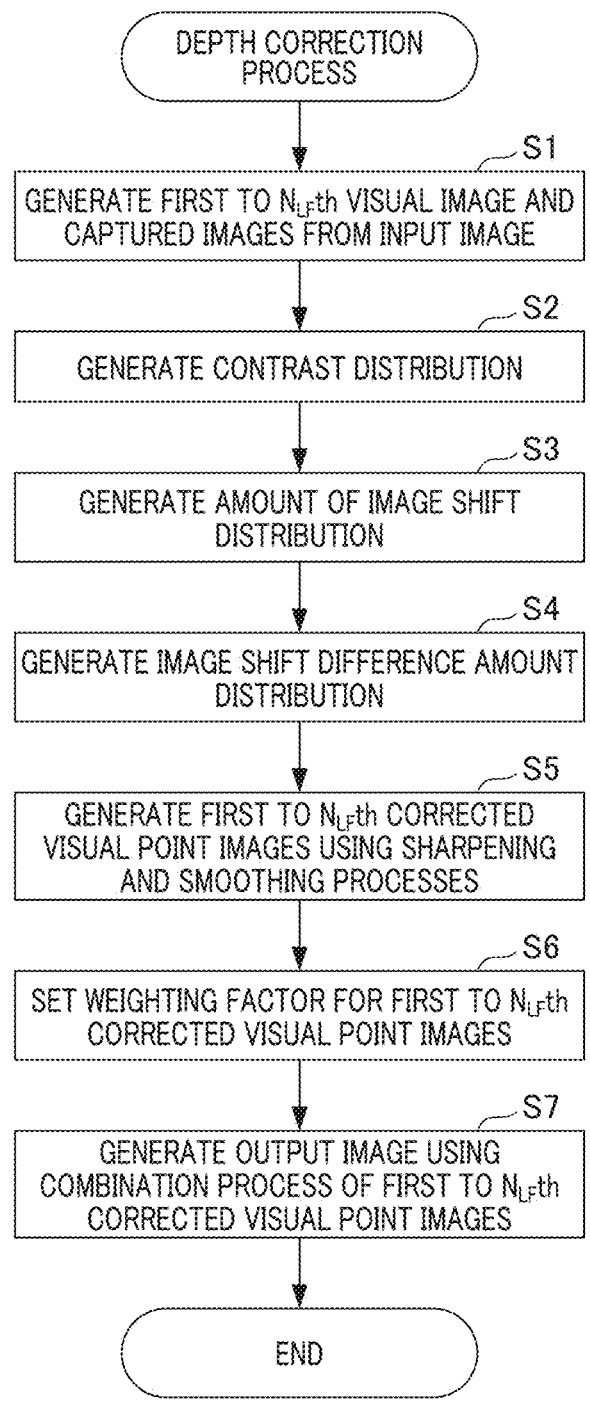
FIG. 9 is a flowchart illustrating a depth correction process based on an image shift amount distribution.

In Step S1 of FIG. 9, a process of generating a plurality of viewpoint images for different pupil partial areas of an image-forming optical system, from LF data acquired by an imaging element is performed and a process of generating a captured image according to a pupil area obtained by combining the different pupil partial areas of the image-forming optical system are performed.

In Step S1, first, LF data is acquired by the imaging element 107 or LF data captured by the imaging element 107 in advance and stored in a recording medium is read. Subsequently, a first viewpoint image to an $N_{LF}^{th}$ viewpoint image are generated for different pupil partial areas of the image-forming optical system, LF data serving as input image data is expressed as LF. Furthermore, a sub-pixel signal of a column direction $i_s$ ($1 \le i_s \le Nx$) and a row direction $j_s$ ($1 \le j_s \le Ny$) in each pixel signal of LF is defined as a kth sub-pixel signal as k=Nx ($j_s$−1)+$i_s$ ($1 \le k \le N_{LF}$). A kth viewpoint image Ik (j,i) of a column direction i and a row direction j corresponding to the kth pupil partial area of the image-forming optical system is generated by formula (1).

$$I_k(j,i) = I_{N_x(j_s-1)+i_s}(j,i) = LF(N_y(j-1)+j_s, N_x(i-1)+i_s). \quad (1)$$

For example, in the case of Nx=2, Ny=1, and $N_{LF}$=2, a signal of a specific sub-pixel from the first sub-pixel 201 and the second sub-pixel 202 which are bisected in the x direction is selected for each pixel from LF data corresponding to a pixel array illustrated in FIG. 2A. A first viewpoint image and a second viewpoint image serving as RGB signals of a Bayer array with a predetermined resolution corresponding to a specific pupil partial area of the first pupil partial area 501 and the second pupil partial area 502 of the image-forming optical system can be generated.

Here, shading according to a pupil shift of the first viewpoint image and the second viewpoint image (the first viewpoint image to the $N_{LF}^{th}$ viewpoint image) will be described. FIGS. 10A to 10C illustrate a relationship between the first pupil partial area 501 received by the first photoelectric conversion unit 301 in a peripheral image height of the imaging element, the second pupil partial area 502 received by the second photoelectric conversion unit 302, and the exit pupil 400 of the image-forming optical system. Note that the same constituent elements as those in FIG. 4 are denoted with the same reference numerals. The first photoelectric conversion unit 301 and the second photoelectric conversion unit 302 (the first photoelectric conversion unit to the $N_{LF}^{th}$ photoelectric conversion unit) correspond to the first sub-pixel 201 and the second sub-pixel 202 (the first, sub-pixel to the $N_{LF}^{th}$ sub-pixel).

FIG. 10A illustrates a case in which a distance D1 of an exit pupil of the image-forming optical system is the same as a set pupil distance Ds of the imaging element. In this case, the exit pupil 400 of the image-forming optical system is substantially uniformly pupil-divided by the first pupil partial area 501 and the second pupil partial area 502. On the other hand, FIG. 10B illustrates a case in which the exit pupil distance D1 of the image-forming optical system is shorter than the set pupil distance Ds of the imaging element. In this case, a pupil shift occurs between an exit pupil of the image-forming optical system and an entrance pupil of the imaging element at the peripheral image height of the imaging element and thus the exit pupil 400 of the image-forming optical system is unevenly pupil-divided. FIG. 10C illustrates a case in which the exit pupil distance D1 of the image-forming optical system is longer than the set pupil distance Ds of the imaging element. Also in this case, a pupil shift occurs between the exit pupil of the image-forming optical system and the entrance pupil of the imaging element at the peripheral image height of the imaging element and thus the exit pupil 400 of the image-forming optical system is unevenly pupil-divided. Intensities of the first viewpoint image and the second viewpoint image also become uneven as pupil division becomes uneven at the peripheral image height, and thus shading in which an intensity of any one of the first viewpoint image and the second viewpoint image becomes large and an intensity of the other viewpoint image becomes small occurs for each RGB signal component.

In order to improve shading of each viewpoint image as necessary, a shading correction process (an optical correction process) may be performed on the first viewpoint image and the second viewpoint image (the first viewpoint image to the $N_{LF}^{th}$ viewpoint image) for each RGB signal component. Furthermore, a defect correction process, a saturation process, a demosaicing process, or the like may be performed as necessary.

In Step S1 of FIG. 9, subsequently, a process of generating a captured image (a combination image) according to a pupil area obtained by combining different pupil partial areas of the image-forming optical system is performed. A captured image I(j,i) of a column direction i and a row direction j is generated by Formula (2).

$$I(j, i) = \sum_{k=1}^{N_{LF}} I_k(j, i) = \sum_{j_S=1}^{N_y} \sum_{i_S=1}^{N_x} LF(N_y(j-1)+j_S, N_x(i-1)+I_S). \quad (2)$$

Figure 11:
FIG. 11 is a diagram illustrating a captured image in the embodiment.

In the embodiment, two divisions in the x axis direction of Nx=2, Ny=1, and $N_{LF}$=2 are illustrated. All signals of the first sub-pixel 201 and the second sub-pixel 202 which are bisected in the x direction for each pixel from LF data corresponding to a pixel array illustrated in FIG. 2A are combined and a captured image signal serving as an RGB signal of a Bayer array with a predetermined resolution is generated. A shading correction process, a defect correction process, a saturation process, a demosaicing process, or the like may be performed as necessary. FIG. 11 illustrates a captured image which is subjected to a demosaicing process according to the embodiment. The object (a doll) is placed in a center and a fine checkered pattern flat plate is placed on the left side to be inclined from the front to the back.

As described above, in the embodiment, a plurality of viewpoint images are generated from an input image acquired by an imaging element, in which a plurality of pixels including a plurality of photoelectric conversion units receiving a luminous flux passing through different pupil partial areas of the image-forming optical system are arranged, for different pupil partial areas. Moreover, a captured image according to a pupil area obtained by combining different pupil partial areas is generated. The present invention is not limited thereto, and any technique that can acquire a plurality of viewpoint images and a combination image thereof using a known technique may be adopted in the embodiment as well as in other embodiments. For example, in a method using a plurality of cameras having different viewpoints, the plurality of cameras can be regarded as the imaging element 107. Furthermore, the imaging element may be provided on an imaging plane such that a luminous flux from an imaging optical system is formed on the microlens array and thus an object plane and the imaging element have a conjugation relationship unlike in optical systems of FIGS. 2A, 2B and 3A to 3D. The imaging element may be provided on the imaging plane by forming a luminous flux from an imaging optical system on the microlens array again (since a luminous flux in which a once formed luminous flux is diffused is formed, the luminous flux is referred to as "reforming"). A method of inserting a mask (a gain modulation element) with an appropriate pattern in an optical path of the imaging optical system can also be used.

[Contrast Distribution]

Next, a process of calculating a contrast distribution will be described. In Step S2 of FIG. 9, a process of extracting a high frequency band component of a spatial frequency for each area from a captured image and a plurality of viewpoint images in the embodiment and generating a contrast distribution is performed. Adjustment according to a difference between viewpoint images is performed on a contrast distribution in the embodiment.

In Step S2 of FIG. 9, first, color gravity centers of each color RGB are matched for each position (j,i) from a captured image I(j,i) serving as an RGB signal of a Bayer array and a imaging luminance signal Y is generated by Formula (3A). Similarly, a kth viewpoint luminance signal Yk is generated by Formula (3B) from a $k^{th}$ viewpoint image Ik (k=1 to $N_{LF}$) serving as an RGB signal of a Bayer array.

$$Y(j, i) = \begin{pmatrix} I(j-1, i-1) & I(j-1, i) & I(j-1, i+1) \\ I(j, i-1) & I(j, i) & I(j, i+1) \\ I(j+1, i-1) & I(j+1, i) & I(j+1, i+1) \end{pmatrix} \begin{pmatrix} \frac{1}{16} & \frac{2}{16} & \frac{1}{16} \\ \frac{2}{16} & \frac{4}{16} & \frac{2}{16} \\ \frac{1}{16} & \frac{2}{16} & \frac{1}{16} \end{pmatrix}, \quad (3A)$$

$$Y_k(j, i) = \begin{pmatrix} I_k(j-1, i-1) & I_k(j-1, i) & I_k(j-1, i+1) \\ I_k(j, i-1) & I_k(j, i) & I_k(j, i+1) \\ I_k(j+1, i-1) & I_k(j+1, i) & I_k(j+1, i+1) \end{pmatrix} \begin{pmatrix} \frac{1}{16} & \frac{2}{16} & \frac{1}{16} \\ \frac{2}{16} & \frac{4}{16} & \frac{2}{16} \\ \frac{1}{16} & \frac{2}{16} & \frac{1}{16} \end{pmatrix}. \quad (3B)$$

In Step S2, subsequently, an imaging high frequency signal dY(j,i) is generated by Formula (4A) from an imaging luminance signal Y (j,i) using a two-dimensional bandpass filter for extracting a high frequency component of a spatial frequency. A two-dimensional bandpass filter is set to be $\{F_{BPF}(j_{BPF}, i_{BPF})|-n_{BPF} \leq j_{BPF} \leq n_{BPF}, -M_{BPF} \leq i_{BPF} \leq m_{BPF}\}$. Similarly, a $k^{th}$ viewpoint high frequency signal dYk(j,i) is generated by Formula (4B) from a kth viewpoint luminance signal Yk(j,i) (k=1 to $N_{LF}$).

$$dY(j, i) = \left| \sum_{j_{BPF}=-n_{BPF}}^{n_{BPF}} \sum_{i_{BPF}=-m_{BPF}}^{m_{BPF}} F_{BPF}(j_{BPF}, i_{BPF}) \times Y(j+j_{BPF}, i+i_{BPF}) \right|, \quad (4A)$$

$$dY_k(j, i) = \left| \sum_{j_{BPF}=-n_{BPF}}^{n_{BPF}} \sum_{i_{BPF}=-m_{BPF}}^{m_{BPF}} F_{BPF}(j_{BPF}, i_{BPF}) \times Y_k(j+j_{BPF}, i+i_{BPF}) \right|. \quad (4B)$$

In the embodiment, two divisions in the x direction with Nx=2, Ny=1, and $N_{LF}$=2 are exemplified. An example in which a two-dimensional bandpass filter is constituted using a direct product of a one-dimensional filter $Fx(i_{BPF})$ in the x direction (a pupil division direction) and a one-dimensional filter Fy ($j_{BPF}$) in the y direction (a direction which is orthogonal to a pupil division direction) is illustrated. In other words, a two-dimensional bandpass filter is set to be $F_{BPF}(j_{BPF}, i_{BPF})=Fy(j_{BPF}) \times Fx(i_{BPF})$. In order to extract a high frequency component of a spatial frequency in the x direction, for example, a one-dimensional bandpass filter such as 0.5×[1,2,0−2,−1]+1.5×[1,0,−2,0,1] can be used as the one-dimensional filter $Fx(i_{BPF})$ in the x direction serving as the pupil division direction.

Here, it is assumed that a mixed filter obtained by combining a first-order differential filter [1,2,0,−2,−1] and a second-order differential filter [1,0,−2,0,1] is used. Generally, when performing a differential type filter process, there is a zero point in a part in which a sign changes from a positive sign to a negative sign in a signal which has been subjected to the filter process. For this reason, a node is generated in an area including a high frequency component of a spatial frequency in some cases due to a combination with an absolute value calculation. A position in which a node is generated differs in accordance with the order of differentiation of a differential type filter. Thus, in the embodiment, occurrence of a node is suppressed using the mixed filter obtained by combining the first-order differential filter and the second-order differential filter (generally, a differential type filter with a different order).

A first-order differential filter such as [1,2,0,−2,−1], a second-order differential filter such as [1,0,−2,0,1], a high-order differential type filter, or a more general one-dimensional bandpass filter may be used as necessary. For example, a high frequency cut (low pass) filter such as

[1,1,1,1,1] or [1,4,6,4,1] can be used as the one-dimensional filter $Fy(j_{BPF})$ in the y direction serving as the direction which is orthogonal to the pupil division direction to suppress high frequency noise in the y direction. A bandpass filter process of extracting a high frequency component of a spatial frequency may be performed in either the x direction or the y direction as necessary. Although a two-dimensional bandpass filter constituted using a direction product of two one-dimensional filters has been exemplified in the embodiment, the present invention is not limited thereto. In addition, a general two-dimensional bandpass filter can be used.

In Step S2 of FIG. 9, subsequently, the normalized imaging high frequency signal $dZ(j,i)$ obtained by normalizing the imaging high frequency signal $dY(j,i)$ using the imaging luminance signal $Y(j,i)$ as $Y0>0$ is generated by Formula (5A). Similarly, the normalized kth viewpoint nigh frequency signal $dZk(j,i)$ obtained by normalizing the kth viewpoint high frequency signal $dYk(j,i)$ ($k=1$ to $N_{LF}$) using the kth viewpoint luminance signal $Yk(j,i)$ is generated by Formula (5B). A maximum value determination with $Y0>0$ of a denominator is to prevent division by 0. High frequency noise can be minimized by performing a high frequency cut (low pass) filter process on the imaging luminance signal $Y(j,i)$ and the $k^{th}$ viewpoint luminance signal $Yk(j,i)$ before the normalization is performed in Formulas (5A) and (5B) as necessary.

$$dZ(j,i)=dY(j,i)/\max(Y(j,i),Y_0), \tag{5A}$$

$$dZ_k(j,i)=dY_k(j,i)/\max(Y_k(j,i),Y_0), \tag{6B}$$

In Step S2, subsequently, an imaging contrast distribution $C(j,i)$ is generated by Formula (6A) as a low luminance threshold value Ymin, a contrast maximum threshold value Cmax, and an index γ. In the first row of Formula (6A), when the imaging luminance signal $Y(j,i)$ is smaller than a low luminance threshold value Ymin, a value of the imaging contrast distribution $C(j,i)$ is set to 0. In the third row of Formula (6A), when the normalized imaging high frequency signal $dZ(j,i)$ is larger than a contrast maximum threshold value Cmax, a value of the imaging contrast distribution $C(j,i)$ is set to 1. Otherwise, in the second row of Formula (6A), the imaging contrast distribution $C(j,i)$ is set to a value obtained by normalizing the normalized imaging high frequency signal $dZ(j,i)$ using the contrast maximum threshold value Cmax and raising the normalized imaging high frequency signal $dZ(j,i)$ to the power of γ. Similarly, a $k^{th}$ viewpoint contrast distribution $Ck(j,i)$ ($k=1$ to $N_{LF}$) is generated by Formula (6B).

$$C(j,i) = \begin{cases} 0 & (Y(j,i) < Y_{min}), \\ (dZ(j,i)/C_{max})^\gamma & (dZ(j,i) \le C_{max}), \\ 1 & (dZ(j,i) > C_{max}). \end{cases} \tag{6A}$$

$$C_k(j,i) = \begin{cases} 0 & (Y(j,i) < Y_{min}), \\ (dZ_k(j,i)/C_{max})^\gamma & (dZ_k(j,i) \le C_{max}), \\ 1 & (dZ_k(j,i) > C_{max}). \end{cases} \tag{6B}$$

As described above, the imaging contrast distribution $C(j,i)$ takes a value within a range of [0,1] (0 or more and 1 or less). With regard to the value of $C(j,i)$, the contrast is low when the value is close to 0 and the contrast is high when the value is close to 1. The value is raised to the power of γ to adjust a tone curve from 0 to 1 of the imaging contrast distribution $C(j,i)$. In order to make a change on a low contrast side gentle and a change on a high contrast side sharp, the index γ is a value of 1.5 or more and 2.5 or less. A combination function $F(C(j,i))$ may be changed to an imaging contrast distribution using a function $F: [0,1] \rightarrow [0,1]$ from a definition domain [0,1] to a value domain [0,1] as necessary.

Figure 12:
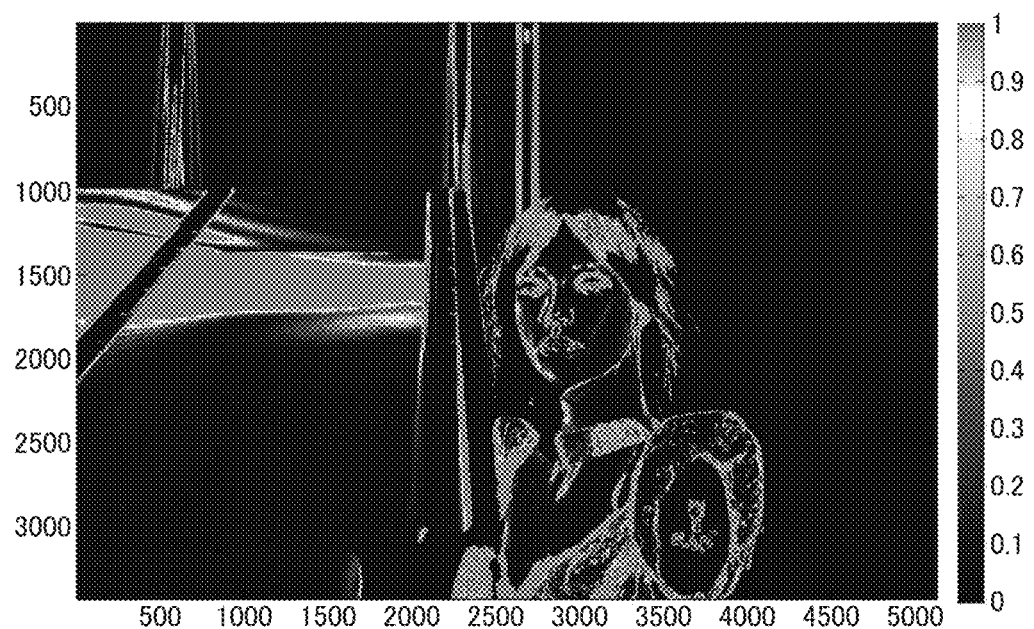
FIG. 12 is a diagram illustrating an imaging contrast distribution of a captured image.
Figure 13:
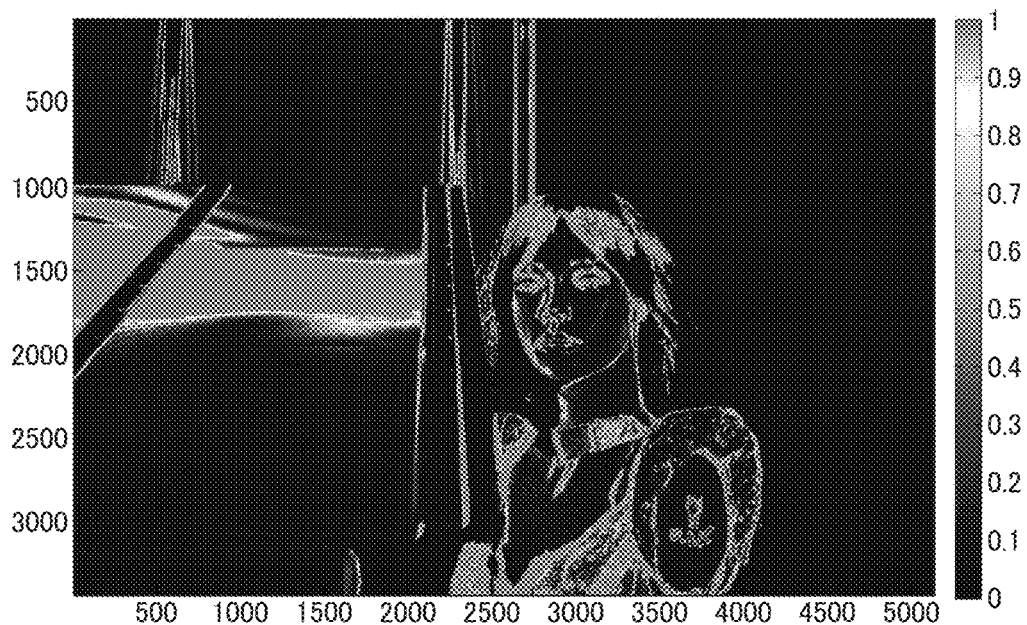
FIG. 13 is a diagram illustrating an example of a first viewpoint contrast distribution of a first viewpoint image.
Figure 14:
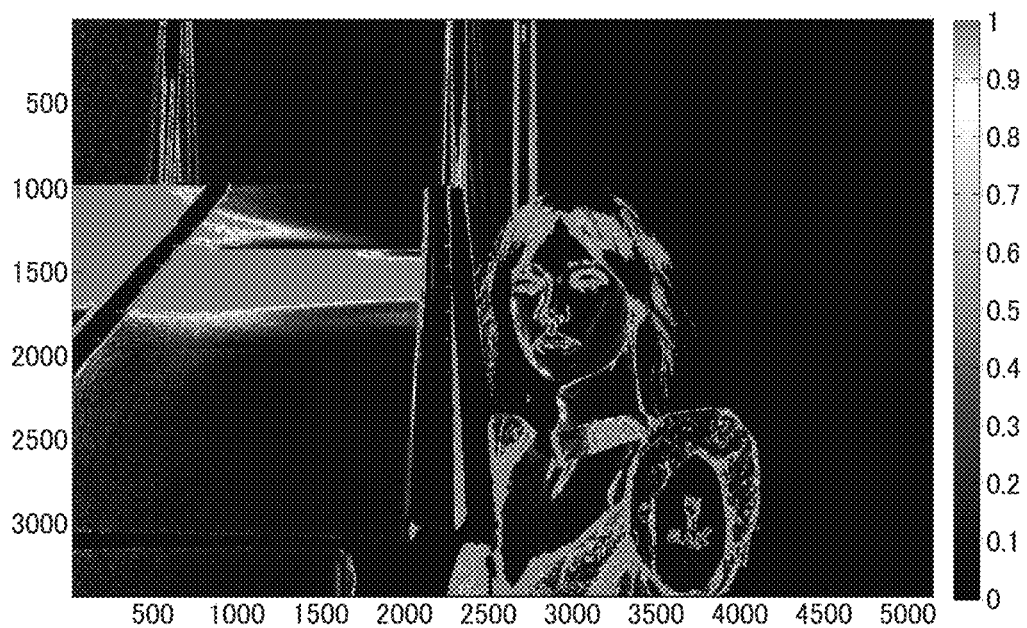
FIG. 14 is a diagram illustrating an example of a second viewpoint contrast distribution of a second viewpoint image.

FIG. 12 illustrates an example of a distribution of the imaging contrast distribution $C(j,i)$ in the embodiment. Furthermore, FIG. 13 illustrates an example of a distribution of a first viewpoint contrast distribution $C_1(j,i)$ and FIG. 14 illustrates an example of a distribution of a second viewpoint contrast distribution $C_2(j,i)$. In the examples of the distribution illustrated in FIGS. 12 to 14, a contrast high and low indication is represented using a gray scale display in a range of [0,1] on the right side. A white part close to 1 has a high frequency component of a spatial frequency in the x direction being large, which indicates a high contrast area. Furthermore, a block part close to 0 has a high frequency component of a spatial frequency in the x direction being small, which indicates a low contrast area.

Figure 15A:
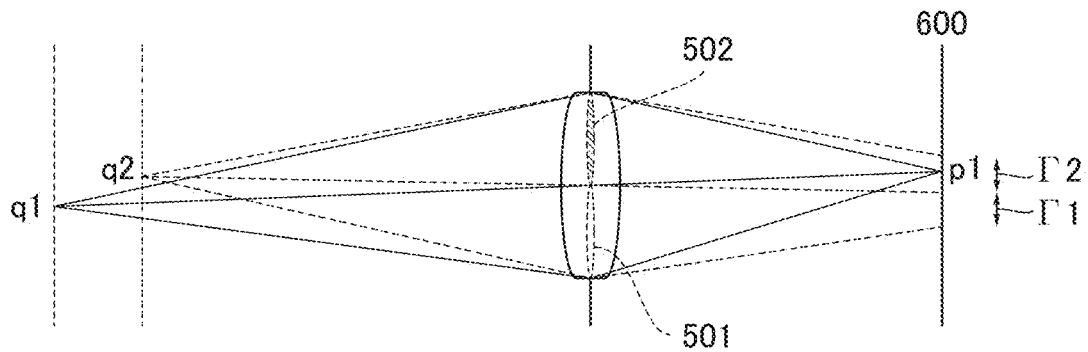
FIGS. 15A to 15C are schematic diagrams illustrating relationships between parallax and a perspective conflict between viewpoint images.
Figure 15B:
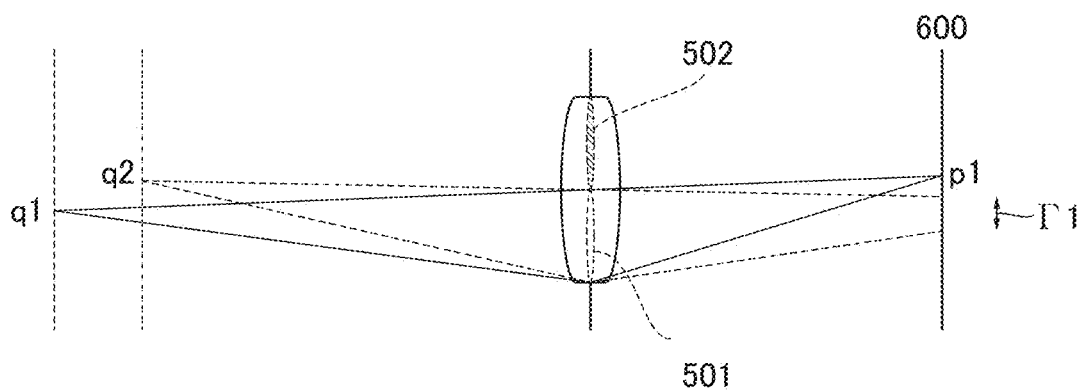
Figure 15C:
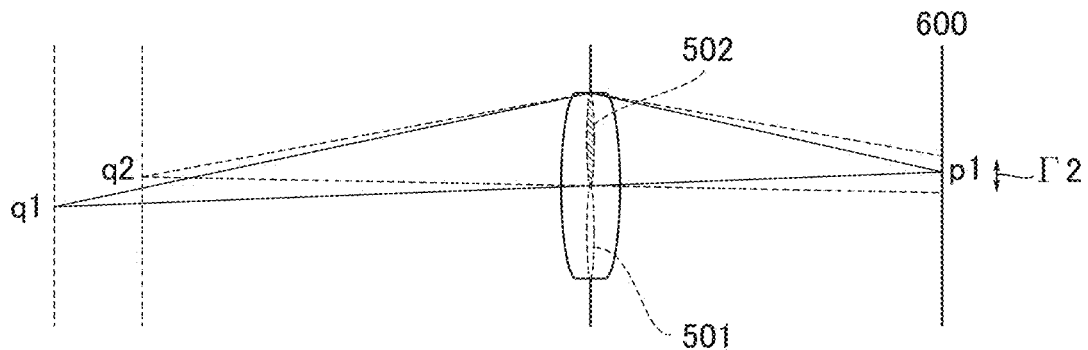

A relationship between parallax between the first viewpoint image and the second viewpoint image as a plurality of viewpoint images in the embodiment and a perspective conflict or occlusion will be described using FIGS. 15A to 15C. In FIGS. 15A to 15C, the imaging element(not shown) according to the embodiment is arranged in the imaging surface 600 and the exit pupil of the image-forming optical system is two-divided into the pupil partial area 501 and the pupil partial area 502 like in FIGS. 4, 7, and 8.

FIG. 15A illustrates an example in which photographing is performed such that a blurred image F1+F2 of an object q2 in front and an in-focus image p1 of an object q1 are superimposed, and a perspective conflict occurs in the photographed image. FIGS. 15B and 15C illustrate such an example using a case in which a luminous flux is divided into a luminous flux passing through the pupil partial area 501 of the image-forming optical system and a luminous flux passing through the pupil partial area 502 of the image-forming optical system as an example.

In FIG. 15B, a luminous flux from the object q1 passes through the pupil partial area 501 and forms an image as an image p1 in an in-focus state, A luminous flux from the object q2 in front (the imaging surface 600 side) passes through the pupil partial area 501, spreads to a blurred image F1 in a defocused state, and is received by a first sub-pixel 201 of each pixel of the imaging element. A first viewpoint image is generated from the light reception signal of the first sub-pixel 201. In the first viewpoint image, the image p1 of the object q1 and the blurred image F1 of the object q2 in front are photographed at different positions without superimposing. A case in which a perspective conflict or occlusion does not occur between the plurality of objects (the object q1 and the object q2) in the first viewpoint image has been provided.

On the other hand, in FIG. 15C, a luminous flux from the object q1 passes through the pupil partial area 502 and forms an image as an image p1. A luminous flux from the object q2 in front passes through the pupil partial area 502, spreads to a blurred image F2 in a defocused state, and is received by a second sub-pixel 202 of each pixel of the imaging element. A second viewpoint image is generated from the light reception signal of the second sub-pixel 202. In the second viewpoint image, the image pi of the object q1 and the blurred image F2 of the object q2 in front are photographed to superimpose. A case in which a perspective conflict or occlusion occurs between the plurality of objects (the object q1 and the object q2) in the second viewpoint image has been provided.

In an example of FIGS. 15A to 15C, in the vicinity of an area in which a perspective conflict or occlusion occurs in a photographed image, a state in which a perspective conflict or occlusion occurs are different between a first viewpoint image and a second viewpoint image constituting the photographed image. In other words, it is shown that a difference between the first viewpoint image and the second viewpoint image is likely to increase. Therefore, an area in which a perspective conflict or occlusion is highly likely to occur can be estimated by detecting an area in which a difference between a plurality of viewpoint images is large.

Figure 16:
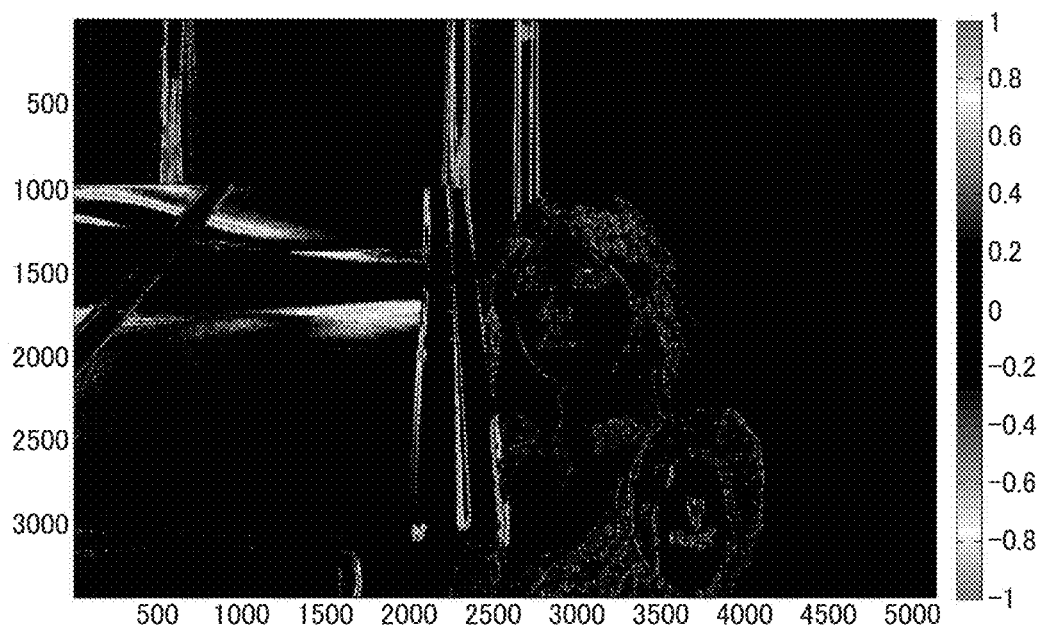
FIG. 16 is a diagram illustrating an example of a contrast difference amount distribution.

FIG. 16 illustrates a difference amount distribution $C_1(j,i) - C_2(j,i)$ of a first viewpoint contrast distribution $C_1(j,i)$ and a second viewpoint contrast distribution $C_2(j,i)$ in the embodiment as an example. In an example of a distribution illustrated in FIG. 16, in a gray scale display in a range of [−1,1] on the right side, a magnitude indication of a difference of contrast of the first viewpoint image and contrast of the second viewpoint image is represented. Such a contrast difference corresponds to an amount of difference between a first viewpoint contrast distribution and a second viewpoint contrast distribution. A black part close to 0 indicates an area in which a contrast difference between the contrast of the first viewpoint image and the contrast of the second viewpoint image is small. On the other hand, a white part near ±1 indicates an area in which a contrast difference between the contrast of the first viewpoint image and the contrast of the second viewpoint image is large.

In FIG. 16, an area in which a perspective conflict or occlusion occurs between the body of a main object (a doll) and a fine-checkered pattern flat plate is detected in a center lower part as a white area in which a contrast difference between the first viewpoint image and the second viewpoint image is large. Furthermore, an area in which a high frequency band component of a spatial frequency largely changes between the first viewpoint image and the second viewpoint image is detected in addition to the area in which a perspective conflict or occlusion occurs. For example, an area in which a high frequency band component of a spatial frequency largely changes between the first viewpoint image and the second viewpoint image such as an area in which an amount of image shift is large while high contrast is maintained or the like, like the object edge in a defocused state are detected. In such detection areas, object images having largely different spatial frequency components are photographed in the first viewpoint image and the second viewpoint image. For this reason, in a captured image obtained by combining the first viewpoint image and the second viewpoint image, such detection areas are areas in which the plurality of object images having largely different spatial frequency components are mixed.

When a strong image process such as sharpening or smoothing is performed on a mixed area of such the plurality of object images having different spatial frequency components, image quality is degraded in some cases. Therefore, in the embodiment, the mixed area of the plurality of object images having different spatial frequency components is detected using an absolute value $|C_1(j,i) - C_2(j,i)|$ of the difference amount distribution between the first viewpoint contrast distribution and the second viewpoint contrast distribution. Moreover, in the detected mixed area, an image process such as sharpening or smoothing is performed to be suppressed. Thus, an image process for sharpening or smoothing can be performed while maintaining good image quality.

In the embodiment, in Step S2 of FIG. 9, subsequently, in order to detect the mixed area of the plurality of object images having different spatial frequency components, a contrast difference amount distribution is generated. To be specific, a contrast difference amount distribution $C_{DIFF}(j,i)$ is generated by Formula (7A) from the first viewpoint contrast distribution $C_1(j,i)$ and the second viewpoint contrast distribution $C_2(j,i)$. Subsequently, an arithmetic process of multiplying the imaging contrast distribution $C(j,i)$ and the contrast difference amount distribution $C_{DIFF}(j,i)$ by Formula (7B) is performed. Thus, a contrast distribution $M_{CON}(j,i)$ in which a value in the mixed area of the plurality of object images having different spatial frequency components is suppressed to close to 0 is generated.

$$C_{DIFF}(j,i) = 1 - |C_1(j,i) - C_1(j,i)|, \tag{7A}$$

$$M_{CON}(j,i) = C(j,i) \times C_{DIFF}(j,i), \tag{7B}$$

The contrast difference amount distribution $C_{DIFF}(j,i)$ is a distribution in a range of [0,1], and the value in an area, in which the contrast difference between the viewpoint images is large and the mixture of the plurality of object images having different spatial frequency component is many, is close to a value of 0. Furthermore, the contrast difference amount distribution $C_{DIFF}(j,i)$ is a distribution in which the contrast difference between the viewpoint images is small and the value in an area, in which the mixture of the plurality of object images having different spatial frequency components is small, is close to a value of 1. The contrast distribution $M_{CON}(j,i)$ is a distribution obtained by multiplying the imaging contrast distribution $C(j,i)$ and the contrast difference amount distribution $C_{DIFF}(j,i)$. Thus, such a distribution is a distribution in which a value of the mixed area of the plurality of object images having different spatial frequency components are suppressed to close to 0.

Figure 17:
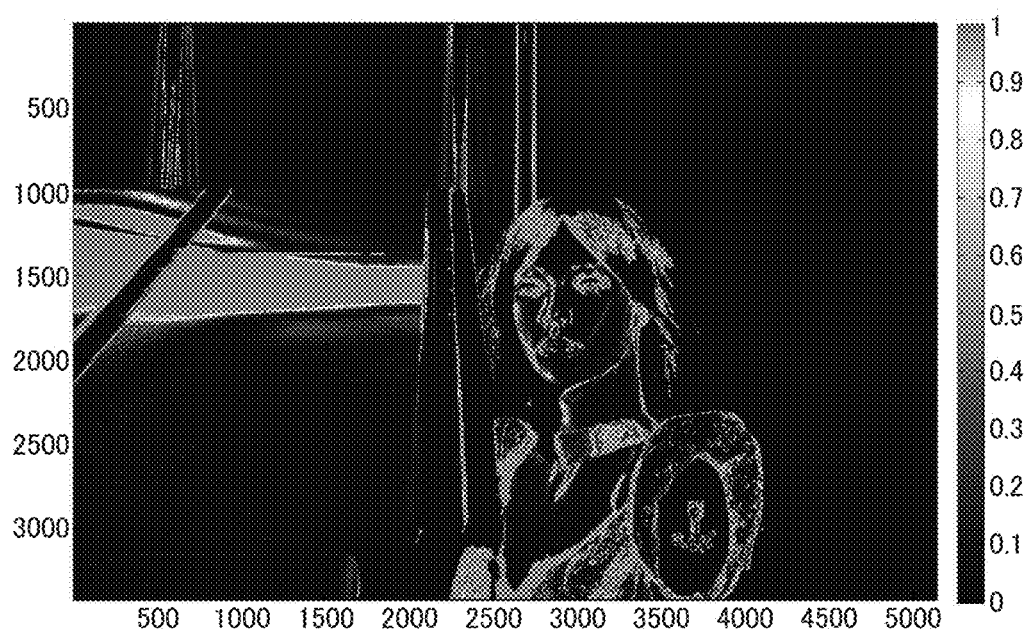
FIG. 17 is a diagram illustrating an example of a contrast distribution.

FIG. 17 illustrates an example of a distribution of the contrast distribution $M_{CON}(j,i)$ in the embodiment. In the example of the distribution illustrated in FIG. 17, in a gray scale display in a range of [0,1] on the right side, a contrast high and low indication is represented. A white part close to 1 indicates a high contrast area in which a high frequency component of a spatial frequency in the x direction is large. A black part close to 0 indicates a low contrast area in which the high frequency component of the spatial frequency in the x direction is small. With regard to the imaging contrast distribution $C(j,i)$ illustrated in FIG. 12, a contrast value in an area in which an absolute value $|C_1(j,i) - C_2(j,i)|$ of a difference amount distribution between the first viewpoint contrast distribution $C_1(j,i)$ and the second viewpoint contrast, distribution $C_2(j,i)$ is large is suppressed.

In the embodiment, a monotonically decreasing linear function is used for the absolute value $|C_1(j,i) - C_2(j,i)|$ of the difference amount distribution between the first viewpoint contrast distribution and the second viewpoint contrast distribution as the contrast difference amount distribution $C_{DIFF}(j,i)$. However, the present invention is not limited thereto, and a more general function may be used as necessary.

As described above, in the embodiment, the contrast, distribution $M_{CON}(j,i)$ is generated in accordance with a contrast difference for each viewpoint image from a captured image and a plurality of viewpoint images. The contrast distribution in the embodiment is larger in an area in which a contrast difference is small than in an area in which the contrast difference for each viewpoint image is large. Furthermore, the contrast distribution in the embodiment is larger in an area in which a spatial frequency component of a captured image in a predetermined spatial frequency band is large than in an area in which the spatial frequency component is small. Furthermore, the contrast distribution in the embodiment is larger in an area in which the luminance of a captured image is high than in an area in which the luminance thereof is low.

In the second process and processes subsequent to the second process, in order to omit the generation of the contrast distribution $M_{CON}(j,i)$ and shorten a process time, for example, a process of recording distribution data is performed. In other words, a process of associating the generated contrast distribution $M_{CON}(j,i)$ with the recorded image data and recording the association on a recording medium such as a flash memory is performed and such distribution data is referred to as necessary.

[Image Shift Amount Distribution]

In Step S3 of FIG. 9, an image shift amount distribution is generated on the basis of correlation (signal coincidence) between the first viewpoint image and the second viewpoint image in each position (j,i) in which a value of the contrast distribution $M_{CON}(j,i)$ is a predetermined value or more.

In Step S3, first, a one-dimensional bandpass filter process is performed on a first viewpoint luminance signal Y1 generated by Formula (3B) in the pupil division direction (a column direction) from a first viewpoint image I1 serving as an RGB signal of a Bayer array. Thus, a first focus detection signal dYA is generated. Furthermore, the one-dimensional bandpass filter process is performed on a second viewpoint luminance signal Y2 generated by Formula (3B) in the pupil division direction (the column direction) from the second viewpoint image I2. Thus, a second focus detection signal dYB is generated. For example, the first-order differential filter $[1,5,8,8,8,8,5,1,-1,-5,-8,-8,-8,-8,-5,-1]$ or the like can be used as the one-dimensional bandpass filter. A bandpass of the one-dimensional bandpass filter may be adjusted as necessary.

In Step S3, Subsequently, an amount of correlation is calculated in each position (j,i) in which a value of the contrast distribution $M_{CON}(j,i)$ is a predetermined value (for example, 0.2) or more. A process of calculating an amount of correlation indicating signal coincidence by relatively shifting the first focus detection signal dYA and the second focus detection signal dYB in the pupil division direction (the column direction) is performed. Moreover, an image shift amount distribution $M_{DIS}(j,i)$ is generated on the basis of the amount of correlation. On the other hand, each position (j,i) in which the value of the contrast distribution $M_{CON}(j,i)$ is less than a predetermined value (for example, 0.2) is excluded from the calculation of the amount of image shift. It is possible to improve detection accuracy of the amount of image shift and increase a processing speed by limiting the detection of the amount of image shift to an area which has high contrast and in which a perspective conflict or occlusion does not occur.

A first focus detection signal in a row direction $j_2^{th}$ ($-n_2 \leq j_2 \leq n_2$) centering on a position (j,i) and a column direction $i_2^{th}$ ($-m_2 \leq i_2 \leq m_2$) serving as the pupil division direction is expressed as $dYA(j+j_2, i+i_2)$, and a second focus detection signal is set as $dYB(j+j_2, i+i_2)$. An amount of shift is expressed as s ($-n_s \leq s \leq n_s$), an amount of correlation in each position (j,i) is expressed as $COR_{EVEN}(j,i,s)$ or an amount of correlation $COR_{ODD}(j,i,s)$. The amount of correlation $COR_{EVEN}(j,i,s)$ is calculated by Formula (8A) and the amount of correlation $COR_{ODD}(j,i,s)$ is calculated by Formula (8B).

$$COR_{even}(j,i,s) = \sum_{j_2=-n_2}^{n_2} \sum_{i_2=-m_2}^{m_2} |dYA(j+j_2, i+i_2+s) - dYB(j+j_2, i+i_2-s)| \quad (8A)$$

$$COR_{odd}(j,i,s) = \sum_{j_2=-n_2}^{n_2} \sum_{i_2=-m_2}^{m_2} |dYA(j+j_2, i+i_2+s) - dYB(j+j_2, i+i_2-1-s)| \quad (8B)$$

The amount of correlation $COR_{ODD}(j,i,s)$ is an amount of correlation obtained by shifting an amount of shift of the first focus detection signal dYA and the second focus detection signal dYB by a half phase-1 shift with respect to the amount of correlation $COR_{EVEN}(j,i,s)$. An average value is calculated by calculating an amount of shift of a real value in which an amount of correlation is a minimum value using a sub-pixel calculation from the amount of correlation $COR_{EVEN}(j,i,s)$ and the amount of correlation $COR_{ODD}(j,i,s)$ and thus the image shift amount distribution $M_{DIS}(j,i)$ is generated. For example, $M_{DIS}(j,i)=0$ is set for an area in which a value of the contrast distribution $M_{CON}(j,i)$ is less than a predetermined value (for example, 0.2) and excluded from the calculation of the amount of image shift. A value other than 0 may be set as necessary.

Figure 18:
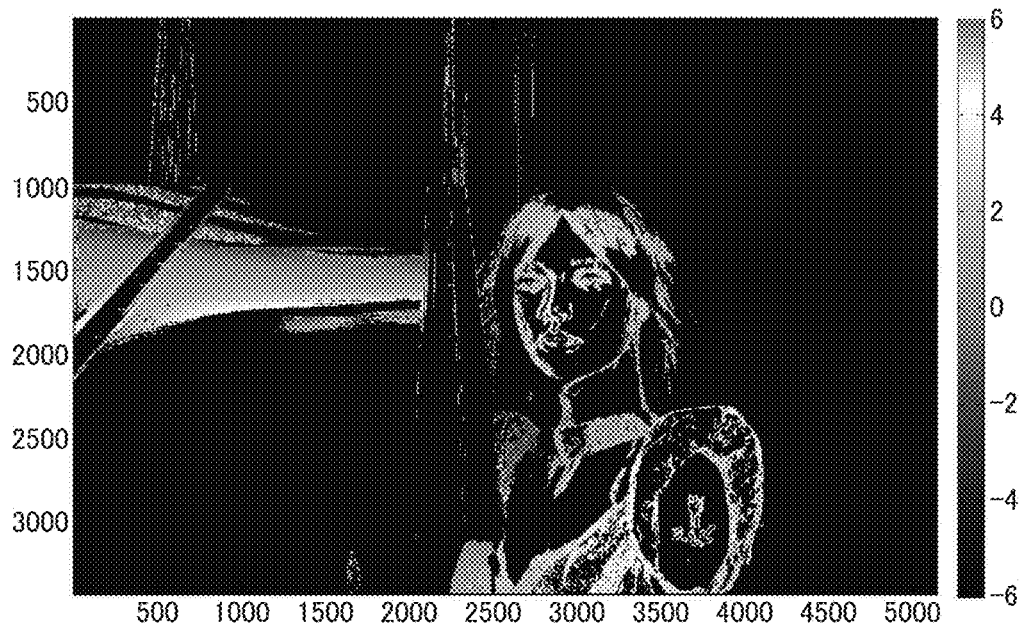
FIG. 18 is a diagram illustrating an image shift amount distribution of a first viewpoint image and a second viewpoint image.

FIG. 18 illustrates an example of a distribution of the image shift amount distribution $M_{DIS}(j,i)$ in the embodiment. A gray scale display in a range of $[-6,6]$ is illustrated on the right side. In the example of the distribution illustrated in FIG. 18, an area in which the value of the contrast distribution $M_{CON}(j,i)$ is a predetermined value 0.2 or more and the amount of image shift is calculated shows the amount of image shift between the first viewpoint image and the second viewpoint image in units of one pixel in a gray scale display. A black-side part of a minus (−) sign indicates an area in the front in-focus state and a part close to 0 indicates an area in the vicinity of in-focus. A white-side part of a plus (+) sign indicates an area in the rear in-focus state. Furthermore, in a display of an example of a distribution of FIG. 18, the value of the contrast distribution $M_{CON}(j,i)$ is less than a predetermined value 0.2 and is excluded from the calculation of the amount of image shift. In other words, an area set as $M_{DIS}(j,i)=0$ is displayed in black.

As described above, in the embodiment, the image shift amount distribution $M_{DIS}(j,i)$ is generated from a plurality of viewpoint images. In order to omit the generation of the image shift amount distribution $M_{DIS}(j,i)$ and shorten a process time in the second process and processes subsequent to the second process, a process of recording the generated image shift amount distribution $M_{DIS}(j,i)$ is performed. In other words, image shift amount distribution data is associated with recorded image data and recorded on a recording medium or the like such as a flash memory. The image shift amount distribution $M_{DIS}(j,i)$ may be multiplied by a conversion coefficient according to a position (j,i), an aperture value of an imaging lens (the image-forming optical system), an exit pupil distance, or the like and converted into a defocus amount distribution indicating a distribution of an amount of defocus of the object in a viewpoint image as necessary.

[Image Shift Difference Amount Distribution]

In Step S4 of FIG. 9, a process of generating an image shift difference amount distribution $M_{DIFF}(j,i)$ is performed from the image shift amount distribution $M_{DIS}(j,i)$ and a predetermined amount of image shift. In Step S4, first, a predetermined amount of image shift p for which a depth correction process is desired to be performed is set. For example, in an example of the image shift amount distribution $M_{DIS}(j,i)$ in FIG. 18, the amount of image shift in an area near the eyes of the main object (the doll) is about 2.5.

When it is desired to perform the depth correction process on the area near the eyes, the predetermined amount of image shift p=2.5 is set.

In Step S4, subsequently, as $\sigma_p > 0$, the image shift difference amount distribution $M_{DIFF}(j,i)$ is calculated from the image shift amount distribution $M_{DIS}(j,i)$, the predetermined amount of image shift p, and the contrast distribution $M_{CON}(j,i)$ using Formula (9).

$$M_{DIFF}(j, i) = \left(1 - \frac{|M_{DIS}(j, i) - p|}{\sigma_p}\right) \times M_{CON}(j, i) \qquad (9)$$

The image shift difference amount distribution $M_{DIFF}(j,i)$ is a distribution obtained by multiplying a linear function monotonically decreasing with respect to an absolute value $|M_{DIS}(j,i)-p|$ corresponding to a difference between the image shift amount distribution $M_{DIS}(j,i)$ and the predetermined amount of image shift p and the contrast distribution $M_{CON}(j,i)$. The image shift difference amount distribution $M_{DIFF}(j,i)$ is positive in $|M_{DIS}(j,i)-p|<\sigma_p$, 0 in $|M_{DIS}(j,i)-p|=\sigma_p$, and negative in $|M_{DIS}(j,i)-p|>\sigma_p$.

An area in which the value of the contrast distribution $M_{CON}(j,i)$ is less than a predetermined value (for example, 0.2) and excluded from the calculation of the amount of image shift is set to $M_{DIFF}(j,i)=(1-|p|/\sigma_p)\times M_{CON}(j,i)$. Other values may be set as necessary.

Figure 19:
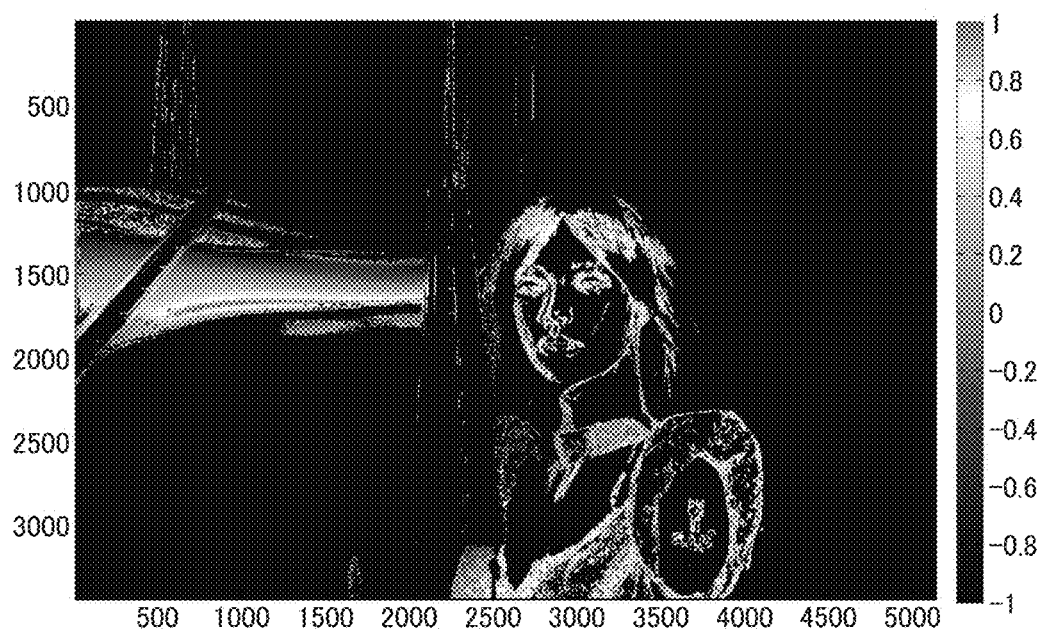
FIG. 19 is a diagram illustrating an image shift difference amount distribution from a predetermined amount of shift.

FIG. 19 illustrates an example of a distribution of the image shift difference amount distribution $M_{DIFF}(j,i)$ in the embodiment. A gray scale display in a range of [−1,1] is illustrated on the right side. In an area in which a value of a contrast distribution $M_{CON}$ is a predetermined value 0.2 or more and an amount of image shift is calculated, an amount of image shift difference is shown in a gray scale display. A white-side part of a plus (+) sign indicates an area in which an absolute value $|M_{DIS}(j,i)|p|$ corresponding to a difference between the image shift amount distribution $M_{DIS}(j,i)$ and the predetermined amount of image shift p and contrast is high. A black-side part of a minus (−) sign indicates an area in which an absolute value $M_{DIS}(j,i)-p|$ corresponding to a difference between the image shift amount distribution $M_{DIS}(j,i)$ and the predetermined amount of image shift p is large and contrast is high. Furthermore, in the display of the example of the distribution in FIG. 19, the value of the contrast distribution $M_{CON}(j,i)$ is less than a predetermined value 0.2 and excluded from the calculation of the amount of image shift. In other words, an area set as $M_{DIFF}(j,i)=(1-|p|/\sigma_p)\times M_{CON}(j,i)$ is indicated in black.

[Corrected Viewpoint Image]

In Step S5 of FIG. 9, sharpening and smoothing processes are performed on a plurality of viewpoint images in accordance with the image shift difference amount distribution $M_{DIFF}(j,i)$. An image obtained by performing sharpening and smoothing processes on a viewpoint image is referred to as a corrected viewpoint image. A first corrected viewpoint image to $N_{LF}{}^{th}$ corrected viewpoint images are generated with respect to the first viewpoint image to the $N_{LF}{}^{th}$ viewpoint image. An example of two divisions will be described below.

In the embodiment, a process of sharpening parallax by enlarging a difference between viewpoint images (crosstalk correction and sharpening) is performed on areas, in which an image shift difference amount distribution is 0 or more ($M_{DIFF}(j,i) \geq 0$), of the first viewpoint image and the second viewpoint image. On the other hand, a process of smoothing parallax by reducing a difference between viewpoint images (crosstalk correction and smoothing) is performed on an area in which an image shift difference amount distribution is less than 0 ($M_{DIFF}(j,i)<0$). The first corrected viewpoint image and a second corrected viewpoint image are generated using the above process.

In Step S5 of FIG. 9, first, an intensity parameter $k_{ct} \geq 0$ for designating strength of a process is set for the first viewpoint image and the second viewpoint image. The intensity parameter $k_{ct}$ is a parameter used to designate strength of a process of sharpening parallax by enlarging a difference between viewpoint images (crosstalk correction and sharpening) or strength of a process of smoothing parallax by reducing a difference between viewpoint images (crosstalk correction and smoothing).

In Step S5, Subsequently, an intensity parameter distribution $K_{ct}(j,i)$ is set by Formula (10). The intensity parameter distribution $K_{ct}(j,i)$ is proportional to the image shift difference amount distribution $M_{DIFF}(j,i)$ with $K_{ct}$ as a proportion coefficient.

$$K_{ct}(j,i) = k_{ct} \times M_{DIFF}(j,i) \qquad (10)$$

In Step S5, subsequently, arithmetic processes of Formulas (11A) and (11B) are performed on the first viewpoint image $I_1(j,i)$ and the second viewpoint image $I_2(j,i)$ (the first viewpoint image to the $N_{LF}{}^{th}$ viewpoint image). A first corrected viewpoint image $MI_1(j,i)$ and a second corrected viewpoint image $MI_2(j,i)$ are generated.

$$\begin{pmatrix} MI_1(j, i) \\ MI_2(j, i) \end{pmatrix} = \begin{pmatrix} 1 + K_{ct}(j, i) & -K_{ct}(j, i) \\ -K_{ct}(j, i) & 1 + K_{ct}(j, i) \end{pmatrix} \begin{pmatrix} I_1(j, i) \\ I_2(j, i) \end{pmatrix}, \qquad (11A)$$

$(K_{ct}(j, i) \geq 0)$, $$\begin{pmatrix} MI_1(j, i) \\ MI_2(j, i) \end{pmatrix} = \begin{pmatrix} \frac{1 - K_{ct}(j, i)}{1 - 2K_{ct}(j, i)} & \frac{-K_{ct}(j, i)}{1 - 2K_{ct}(j, i)} \\ \frac{-K_{ct}(j, i)}{1 - 2K_{ct}(j, i)} & \frac{1 - K_{ct}(j, i)}{1 - 2K_{ct}(j, i)} \end{pmatrix} \begin{pmatrix} I_1(j, i) \\ I_2(j, i) \end{pmatrix}, \qquad (11B)$$

$(K_{ct}(j, i) < 0)$.

A process of Formula (11A) is a process of sharpening parallax by enlarging a difference between a first viewpoint image and a second viewpoint image in an area in which an intensity parameter distribution (an image shift difference amount distribution) is 0 or more ($K_{ct}(j,i)=k_{ct} \times M_{DIFF}(j,i) \geq 0$). In other words, crosstalk correction and sharpening processes are performed using Formula (11A).

On the other hand, a process of Formula (11B) is a process of smoothing parallax by reducing a difference between a first viewpoint image and a second viewpoint image in an area in which the intensity parameter distribution (the image shift difference amount distribution) is less than 0 ($K_{ct}(j,i)=k_{ct} \times M_{DIFF}(j,i)<0$). In other words, crosstalk correction and smoothing processes are performed using Formula (11B).

Figure 20:
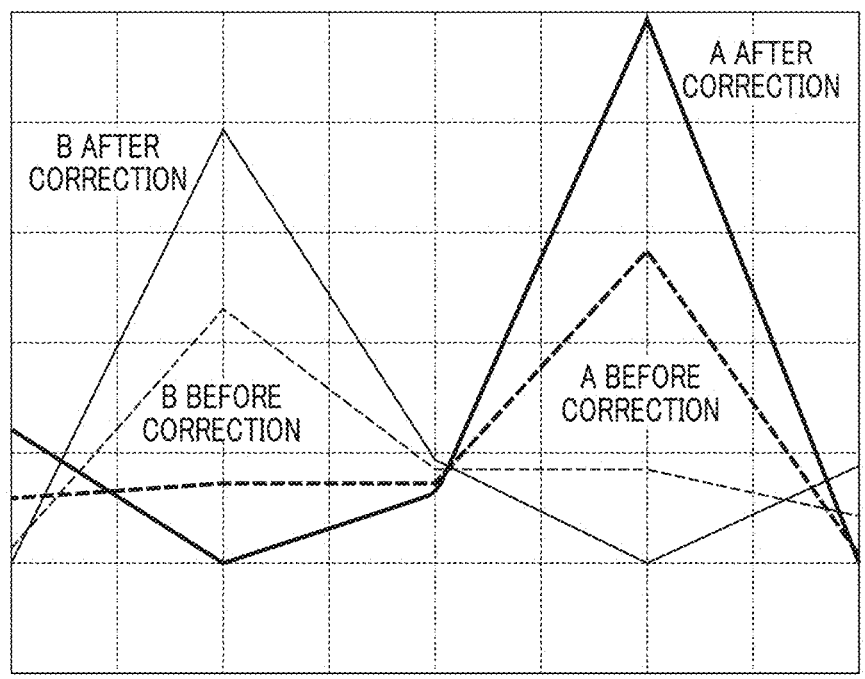
FIG. 20 is a diagram illustrating a sharpening process according to the embodiment.

FIG. 20 is a diagram for describing an example of a process of sharpening parallax by enlarging a difference between a first viewpoint image and a second viewpoint image (crosstalk correction and sharpening) using a graph. A horizontal axis represents a pixel position and a vertical axis represents a pixel value (a signal level). FIG. 20 illustrates examples of a first viewpoint image (A before correction) and a second viewpoint image (B before correction) before crosstalk correction and sharpening processes are performed using graphs of broken lines. Furthermore, examples of a first corrected viewpoint image (A after correction) and a second corrected viewpoint image (B after correction) after crosstalk correction and sharpening processes have been performed by Formula (11A) are illustrated using graphs of solid lines. A part in which a difference between viewpoint images before the processing is further enlarged through a process of sharpening parallax by enlarging a difference between a plurality of viewpoint images, but a part in which a difference between a plurality of viewpoint images before the processing does not change so much. In this way, it can be seen that parallax between a plurality of viewpoint images is sharpened.

On the other hand, in a process of performing smoothing (crosstalk correction and smoothing) using Formula (11B), a difference between a first viewpoint image and a second viewpoint image is reduced and parallax between a plurality of viewpoint images is smoothed.

As described the above, in the embodiment, an image process of performing sharpening and smoothing according to a contrast distribution and an image shift amount distribution is performed on a plurality of viewpoint images. The image process according to the contrast distribution and the image shift amount distribution may be a sharpening process, a smoothing process, or a combination thereof as necessary.

In the embodiment, an arithmetic process is performed using Formula (7A), Formula (7B), Formula (9), Formula (10), Formula (11A), and Formula (11B). An image process such as sharpening or smoothing for each parallax image is performed more strongly on an area in which a contrast difference for each viewpoint image is small than on an area in which the contrast difference is large. Furthermore, an image process such as sharpening or smoothing for each parallax image is performed more strongly on an area in which a contrast distribution is large than on an area in which the contrast distribution is small.

In the embodiment, a sharpening process is performed on an area in which a difference from a predetermined amount of shift of an image shift amount distribution is small and a smoothing process is performed on an area in which a difference is large using Formula (9), Formula (10), Formula (11A), and Formula (11B). In the embodiment, the sharpening process is performed more strongly on an area in which a difference from a predetermined amount of shift of an image shift amount distribution is small than on an area in which the difference is large using Formula (9), Formula (10), and Formula (11A). In the embodiment, a smoothing process is performed more strongly on an area in which a difference from a predetermined amount of shift of an image shift amount distribution is large than on an area in which the difference is small using Formula (9), Formula (10), and Formula (11B).

Also, in the embodiment, a plurality of corrected viewpoint images are generated by performing a process of sharpening parallax by enlarging a difference between a plurality of viewpoint images or smoothing parallax by reducing a difference between a plurality of viewpoint images for each pixel of a plurality of viewpoint images using Formula (11A) and Formula (11B). The sharpening process of Formula (11A) and the smoothing process of Formula (11B) is an arithmetic process between a first viewpoint image $I_1(j,i)$ serving as an output signal of a first photoelectric conversion unit included in each (j,i) pixel and a second viewpoint image $I_2(j,i)$ serving as an output signal of a second photoelectric conversion unit.

[Weighting Factor]

In Step S6 of FIG. 9, in order to slightly modify the depth of field in an area in which the value of the image shift amount distribution $M_{DIS}(j,i)$ is close to the predetermined amount of image shift p, a process of setting a weighting factor is performed. The weighting factor is set for each first corrected viewpoint image and second corrected viewpoint image on the basis of the image shift difference amount distribution $M_{DIFF}(j,i)$.

In Step S6, a first weighting factor distribution $W_1(j,i)$ of the first corrected viewpoint image $MI_1(j,i)$ is calculated by Formula (13A) from the image shift difference amount distribution $M_{DIFF}(j,i)$. A second weighting factor distribution $W_2(j,i)$ of the second corrected viewpoint image $MI_2(j,i)$ is calculated by Formula (13B).

$$W_1(j,i)=1+\max(M_{DIFF}(j,i),0), \qquad (13A)$$

$$W_2(j,i)=1-\max(M_{DIFF}(j,i),0). \qquad (13B)$$

A difference between the first weighting factor distribution $W_1(j,i)$ and the second weighting factor distribution $W_2(j,i)$ is $|W_1(j,i)-W_2(j,i)|=\max(M_{DIFF}(j,i),0)$. Therefore, in the embodiment, the difference $|W_1(j,i)-W_2(j,i)|$ between the weighting factors is larger in an area in which a difference from, a predetermined amount of shift of an image shift amount distribution is small than in an area in which the difference is large. Smoothing may be performed by performing a nigh frequency cut (low pass) filter process on the first weighting factor distribution $W_1(j,i)$ and the second weighting factor distribution $W_2(j,i)$ as necessary.

[Combination Process]

In Step S7 of FIG. 9, a process (a combination process) of multiplying each first corrected viewpoint image and second corrected viewpoint image and the weighting factor and adding the multiplied results by Formula (14) is performed. An output image $I_s(j,i)$, a depth of which is corrected, on the basis of the image shift amount distribution $M_{DIS}(j,i)$ is generated.

$$I_s(j,i)=W_1(j,i)\times MI_1(j,i)+W_2(j,i)\times MI_2(j,i). \qquad (14)$$

The first weighting factor distribution $W_1(j,i)$ of Formula (13A) is multiplied by the first corrected viewpoint image $MI_1(j,i)$ and the second weighting factor distribution $W_2(j,i)$ of Formula (13B) is multiplied by the second corrected viewpoint image $MI_2(j,i)$. Thus, it is possible to correct the depth of field in an area in which the value of the image shift amount distribution $M_{DIS}(j,i)$ is close to the predetermined amount of image shift p. In the embodiment, an output image is generated by generating an image shift amount distribution from a plurality of viewpoint images and multiplying each of a plurality of viewpoint images and the weighting factor to combine the viewpoint images on the basis of the image shift difference amount distribution.

[Depth Correctable Range]

Figure 21:
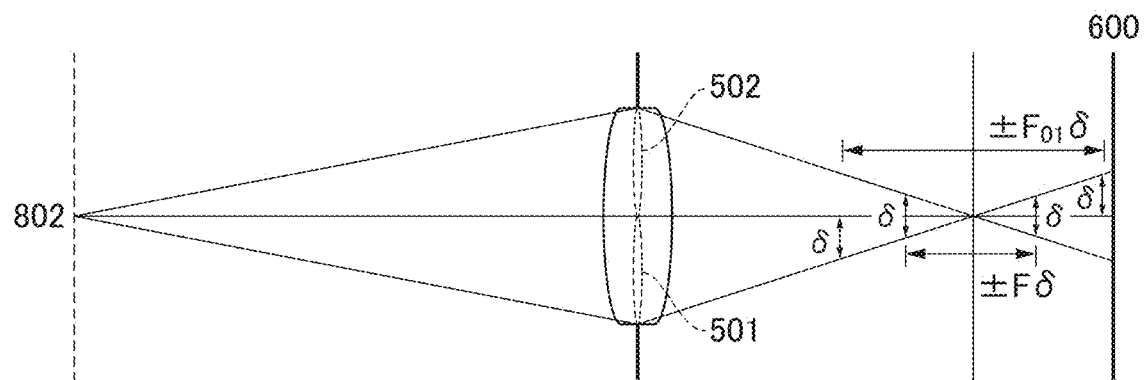
FIG. 21 is a schematic explanatory diagram illustrating a depth correctable range using a combination process according to the embodiment.

A depth correctable range using the combination process in the embodiment will be described with reference to a schematic diagram of FIG. 21. An imaging element (not shown) is arranged in the imaging surface 600, and an exit pupil of the image-forming optical system is two-divided into the first pupil partial area 501 and the second pupil partial area 502 like in FIGS. 4, 7, and 8.

When an allowable diameter of confusion circle is set as $\delta$ and an aperture value of the image-forming optical system is set as F, the depth of focus at an aperture value F is $\pm F\times\delta$. On the other hand, an effective aperture value $F_{01}$ (or $F_{02}$) of in the pupil division direction (the x direction) of the pupil partial area 501 (or 502) narrowed by being divided into Nx×Ny (for example, 2×1) is $F_{01}=Nx\times F$ (or $F_{02}=Nx\times F$), which becomes dark. An effective depth of focus for each first corrected viewpoint image (or second corrected viewpoint image) is $\pm Nx\times F\times\delta$, which is Nx times deeper and thus an in-focus range widens Nx times. The object image focused for each first corrected viewpoint image (or second corrected viewpoint image) is acquired in a range of the effective depth of focus "Nx×F×δ." Therefore, the depth of focus in the pupil division direction can be made approximately Nx times deeper by setting a weighting factor of one corrected viewpoint image to 1 and a coefficient of another corrected viewpoint image to 0.

However, as illustrated in the example of the pupil intensity distribution of FIG. 6, in the case of a microlens having a diameter of several micrometers and pupil division using a photoelectric conversion unit divided into a plurality of parts formed for each pixel unit, gentle pupil division is performed due to diffraction blur due to the wave nature of light. For this reason, the depth of focus in the pupil division direction (the x direction) of the first viewpoint image and the second viewpoint image does not become sufficiently deep, and a depth correction effect is not obtained sufficiently in some cases even when the depth correction process is performed using the first, viewpoint image and the second viewpoint image.

In the embodiment, in the depth correction using the combination process, a process is performed on each pixel, in which the intensity parameter distribution (the image shift difference amount distribution) is 0 or more ($K_{ct}(j,i)=k_{ct} \times M_{DIFF}(j,i) \geq 0$), of a plurality of viewpoint images using Formula (11A). In other words, the first corrected viewpoint image and the second corrected viewpoint image are generated by performing a process of enlarging a difference between the first viewpoint image and the second viewpoint image and sharpening parallax (crosstalk correction and sharpening). Thus, it is possible to increase an effective aperture value IF in the pupil division direction (the x direction) of a plurality of corrected viewpoint images, correct the depth of focus deeply, and improve a depth correction effect.

Next, a display of an obtained depth correction image and a method of setting contents of an image process performed on a depth correction image will be described with reference to a flowchart of FIG. 22. Note that the process illustrated in FIG. 22 is performed using the CPU 121 and the image processing circuit 125.

Figure 22:
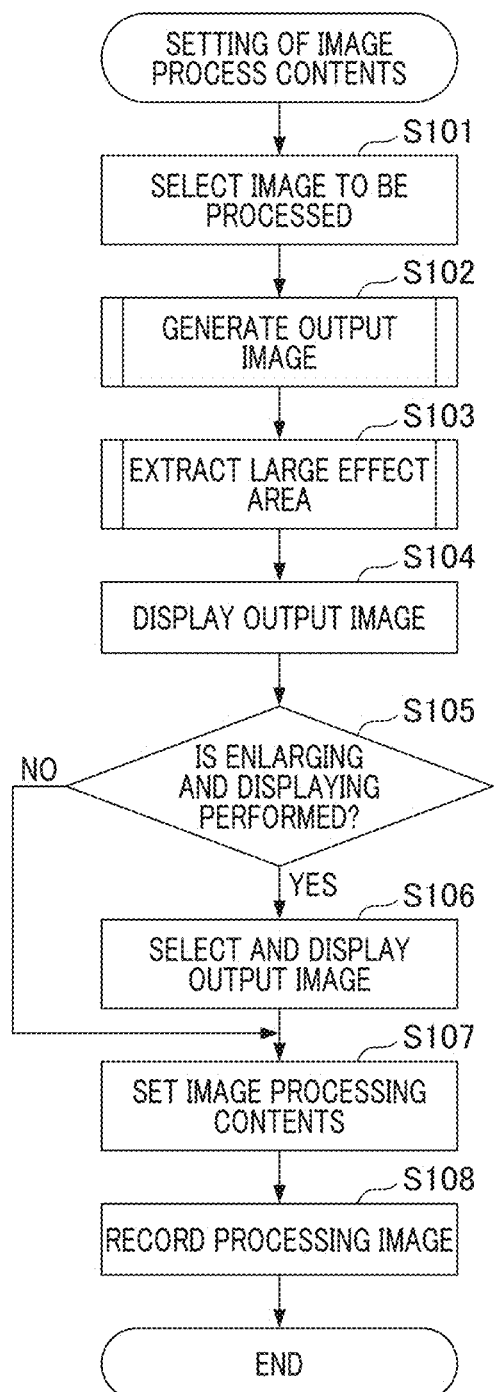
FIG. 22 is a flowchart illustrating setting of image processing content of the embodiment.

In Step S101 of FIG. 22, an image to be processed is selected from images recorded in the flash memory 133 of the imaging apparatus. One or more images are displayed on the screen of the display unit 131, and the user can select an arbitrary image.

Subsequently, in Step S102, a process of generating the depth correction image (the output image) described with reference to FIG. 9 is performed. At a time of Step S102, the setting intended by the user concerning strength, an area, and the like of an image process to be performed on a photographed image is not completed. For this reason, in Step S102, for a plurality of conditions which can be set by the user, a process of generating a depth correction image is performed. In the embodiment, with regard to the predetermined amount of image shift p set in Step S4 of FIG. 9, it is assumed that the depth correction image is generated under a plurality of conditions. For example, when the predetermined amount of image shift p is set from −3 to +3 in 1 increments, seven types of depth correction images are generated. At that time, initial setting values are used as parameters for determining various threshold values at the time of generating the above depth correction image, an area on which an image process is performed such as $\delta_p$ and $k_{ct}$, and strength. Such parameters may be changed when the user decides the strength of an image process.

Subsequently, in Step S103, with regard to a plurality of generated depth correction images, an image processing effect is determined. An area in which an image processing effect is relatively large is extracted as a characteristic area on the basis of the determination result. The depth correction process in the embodiment is a process of enlarging the depth of focus to about the number of divisions (Nx) times as described in the above depth correctable range. On the other hand, since a size of a screen of a display unit 131 of the imaging apparatus is limited due to portability or the like of the imaging apparatus, it is difficult for the user to set an area to be subjected to the depth correction or confirm an effect of the depth correction. In the embodiment, in Step S103, the CPU 121 and the image processing circuit 125 extract the areas in which the effect can be easily obtained by the image process (hereinafter also referred to as a "large effect area"). Details of the process will be described below.

Subsequently, in Step S104, the display unit 131 displays the processed image selected in Step S101 on the screen thereof. At that time, the large effect area extracted in Step S103 is also displayed. The display of the large effect area will be described with reference to FIG. 23.

Figure 23:
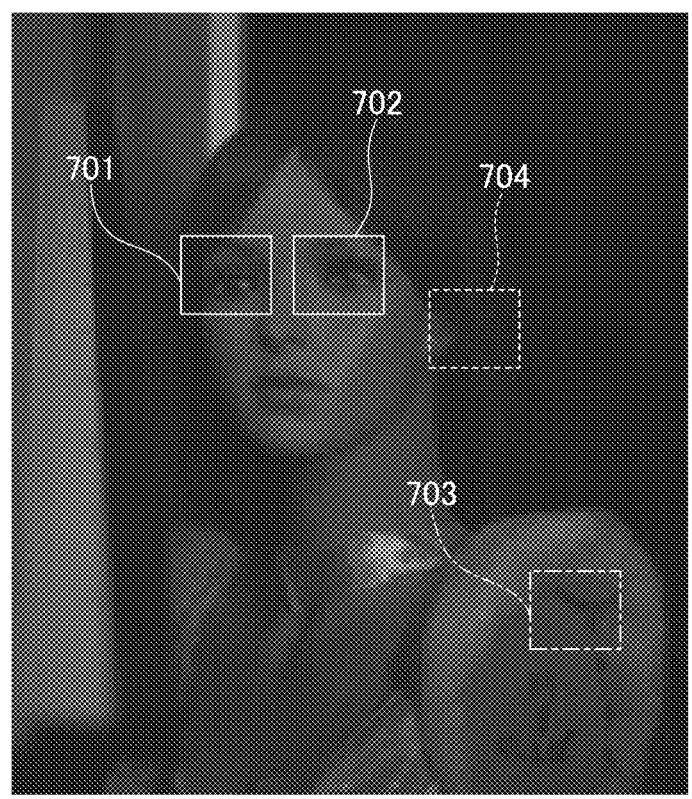
FIG. 23 is a schematic explanatory diagram illustrating a display process according to the embodiment.

FIG. 23 illustrates an example in which four frames 701 to 704 are superimposed and displayed on the image selected in Step S101, A type of line of a frame to be displayed corresponds to the predetermined amount of image shift p. For example, at a time of the predetermined amount of image shift p=1, large effect areas having a large effect of the image process is indicated by the two frames (701 and 702) arranged near the eyes of the object (the doll) as indicated by solid lines. On the other hand, at a time of the predetermined amount of image shift p=−2, a large effect area is displayed as the frame (703) indicated by an alternating single-dot-dash line. Furthermore, at a time of the predetermined amount of image shift p=2, a large effect area is displayed as the frame (704) indicated by a broken line. There is no area in which a large effect of the image process is obtained depending on a predetermined amount of image shift in some cases. In this case, a frame corresponding to the predetermined amount of image shift is not displayed. When there is no large effect area regardless of the value of the predetermined amount of image shift, the user is notified of the fact, and a process of prompting selection or re-photographing of another processed image is performed.

Although a configuration for distinguishing and displaying an area having an large image processing effect has been described using the predetermined amount of image shift as a parameter in the embodiment, parameters used for distinguishing a display are not limited thereto. For example, the image processing apparatus may decide a predetermined amount of image shift and display, for example, distinguishing for each intensity of sharpness as a parameter for performing another image process. Thus, the user can easily distinguish and recognize the intensity of sharpness or the like recommended by the image processing apparatus for each area. Similarly, a display for distinguishing each parameter for determining various threshold values at a time of generating a depth correction image, an area on which an image process such as $\delta_p$ and $k_{ct}$, and strength may be performed for each parameter.

As described the above, in the embodiment, processing contents which can be set by the user is assumed in advance and an area in which a large image processing effect of depth correction is obtained in a plurality of predetermined amount of image shift is displayed. The user can easily determine which area should be focused on and an image process should be performed before performing the image process.

Furthermore, the user can easily determine which area obtains the same depth correction effect by distinguishing a display frame for each predetermined amount of image shift.

In the next Step S105, the CPU 121 determines whether there is an instruction used to perform enlarging and displaying according to the user's operation. When it is determined that there is no instruction used to perform enlarging and displaying, the process moves to a process of Step S107, When it is determined that an instruction used to perform enlarging and displaying is received, the process moves to a process of Step S106. An instruction used to perform enlarging and displaying is performed, for example, when the user touches the displayed frame on the screen of the display unit.

In Step S106, an image to be displayed is selected from images corresponding to a plurality of predetermined amounts of image shift calculated in Step S102. A process of selecting an image corresponding to a predetermined amount of image shift in which a large effect of the depth correction process is obtained in a frame selected at a time of performing enlarging and displaying, and enlarging and displaying the vicinity of an area of the selected frame is performed. At the time of performing enlarging and displaying, a predetermined enlargement ratio such as 5 times and 10 times or an enlargement ratio according to the object size is set or an enlargement ratio according to a size of an area in which an effect of the depth correction process is obtained is set as an enlargement ratio. At that time, an enlargement process is performed so that an area in which an effect of a depth correction process is obtained is included in a display area.

Also, an enlargement ratio may be set as an enlargement ratio at which an effect of the depth correction process can be confirmed. When the object pattern of a depth correction area has a lot of high frequency components, it is necessary to confirm an effect of depth correction with a larger enlargement ratio. An amount of signal of a high frequency component is acquired using the above contrast distribution or another method and an enlargement ratio is set. Alternately, an enlargement ratio may be set in accordance with strength of sharpening or smoothing of an image process being performed. When a stronger sharpening is performed, the user can confirm an image processing effect with a small enlargement ratio.

At a time of displaying images, in order to easily recognize an image processing effect, images before and after-processing may be alternately displayed. At the time of alternately displaying images, an image obtained by emphasizing a processed image and an image process area using a highlight display or the like in units of pixels may be used as the processed image and the image process area. In the highlight display, a noticeable color is selected for a color around an image process area.

In a display method such as an alternate display, it is easy for the user to easily recognize an area objected to an image processing effect, but it is difficult for the user to recognize the applied image processing effect itself in some cases. For this reason, a state in which an image which has been subjected to an image process is displayed and a state in which an area subjected to an image processing effect such as an alternate display is emphasized and displayed may be switched by an operation member or the like. For example, an emphasis display is performed only while the user presses a predetermined operation member.

In this way, a display method of easily recognizing an image processing effect can be realized in accordance with a display form by switching between a method of displaying a frame corresponding to a large effect area as a characteristic area before and after the enlargement and a method of displaying a characteristic area in units of pixels using a highlight display or the like.

Next, in Step S107, a process of setting image processing contents is performed. For example, an intensity parameter ($k_{ct}$) at a time of generating the first corrected viewpoint image $MI_1(j,i)$ and the second corrected viewpoint image $MI_2(j,i)$ is set in accordance with the user's instruction. An image process according to setting contents is performed and a processed image is displayed. In addition, sharpness adjustment, gamma correction, or the like may be performed as image processing contents by the user. Furthermore, an image in a state in which a predetermined amount of image shift is set is displayed so that a depth correction effect increases as a default display image, but the predetermined amount of image shift may be changed in accordance with the user's intention.

Figure 24:
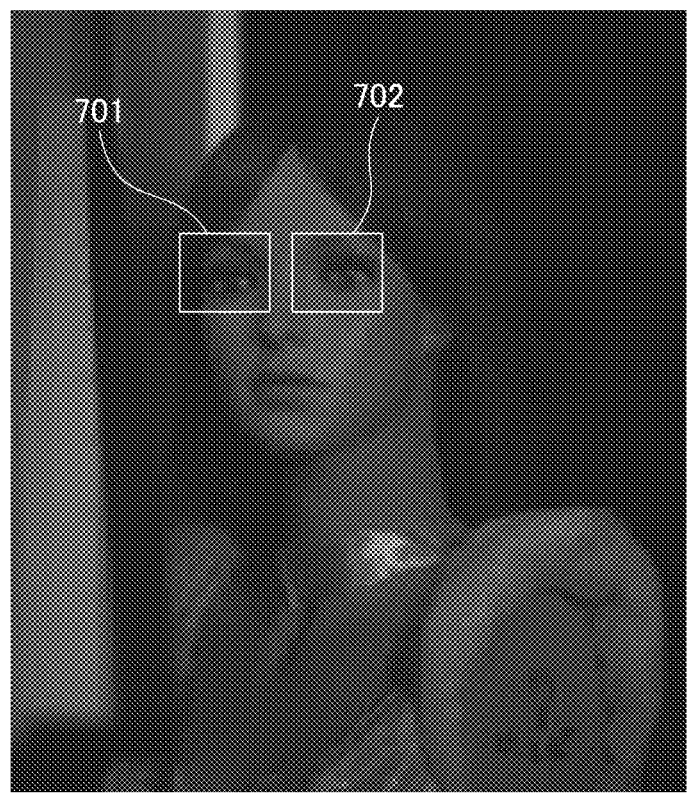
FIG. 24 is a schematic explanatory diagram illustrating a display of the embodiment after image processing content is determined.

After the setting of the image processing contents, the enlarging and displaying is interrupted and the full screen display is changed. At that time, narrowing down is performed on an area subjected to an image processing effect, and an area in which the effect is obtained is displayed. FIG. 24 illustrates an example of a display after setting of an image process has been completed. A display state after enlarging an image in the frame 702 and confirming an image processing effect is illustrated. The frame 701 having the predetermined amount of image shift which is the same as the predetermined amount of image shift of the frame 702 is displayed. The frames (703 and 704) having a predetermined amount of image shift which is not the same as that of the frame 702 and corresponding to another amount of image shift are not displayed. In this way, the CPU 121 narrows down a characteristic area to be displayed before and after deciding an area subjected to an image processing effect in a process of deciding image processing contents. This is because the CPU 121 has determined that a depth correction area desired by the user is the frame 702, and an area in which an area subjected to a further image processing effect is displayed in an easy-to-understand manner. Furthermore, the user can easily recognize that there is an area in which an effect can be obtained other than an area confirmed while performing enlarging and displaying.

Subsequently, the process moves to a process of Step S108. In addition, when the completion of the image process is detected, a recording process of a processed image (an image which has been processed) is performed. The CPU 121 performs control to record image data of the processed image on a recording medium in addition to image data before the processing, and completes the setting of the image processing contents.

A sub-routine associated with the extraction of the large effect area illustrated in Step S103 of FIG. 22 will be described with reference to a flowchart of FIG. 25. The process in FIG. 25 is performed using the CPU 121 and the image processing circuit 125.

Figure 25:
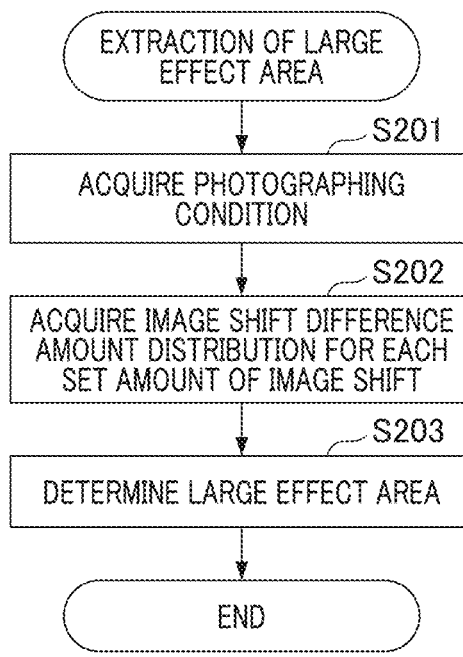
FIG. 25 is a flowchart illustrating an area extraction process according to the embodiment.

In Step S201 of FIG. 25, a process of acquiring a photographing condition of a selected image is performed. A photographing condition is a condition concerning an F number of an imaging optical system or a setting value of an international organization for standardization (ISO) sensitivity. Subsequently, in Step S202, an image shift difference amount distribution for each set amount of image shift is acquired. After that, the process moves to a process of Step S203, a determination process is performed on an area having a large effect of depth correction, and a determination result is obtained for the entire image and for each partial area. First, the CPU 121 determines whether a depth correction effect is obtained as the entire image from the photographing condition acquired in Step S201. When an F number is small and an aperture value is small, since an amount of image shift with respect to defocus amount information is small, the image shift difference amount distribution tends to be small as a whole. For this reason, it is difficult to obtain a depth correction effect in the entire image. Furthermore, since a single-to-noise (S/N) ratio of an image signal is small and noise is large with respect to a signal in an image when a setting value of an ISO sensitivity is large, it is difficult to obtain a reliable amount of image shift. A depth correction effect is also difficult to recognize due to an influence of noise included in the image signal.

Subsequently, the CPU 121 determines the magnitude of an effect for each partial area in an image. First, a process of extracting an area with a large effect as a characteristic area using a depth and the object distance of the object is performed. When a photographing distance is outside of a predetermined distance range and is too short, a range in a depth direction which is subjected to depth correction in the object space corresponding to a unit amount of image shift (a space occupied by the object in the object field) is narrow. For this reason, an area in a screen in which depth correction can be performed on a depth of the object tends to narrow. Similarly, when a photographing distance is outside of a predetermined distance range and is too long, a range in a depth direction which is subjected to depth correction in the object space corresponding to a unit amount of image shift is wide. For this reason, an area in a screen in which depth correction can be performed on a depth of the object tends to widen. In other words, in order to obtain a depth correction effect appropriately, it is necessary that a range in a depth direction of the object desired to be subjected to depth correction and a distance of the object are appropriate.

In the embodiment, a process of detecting that a depth adjustable range of the depth of the object is narrow in the image shift difference amount distribution is performed as the number of pixels serving as a positive value in a partial area in an image. When an area in which the amount of image shift difference is a positive value is small, the CPU 121 determines that an area on which the sharpening process is performed is narrow and an effect is small. Similarly, the CPU 121 determines that the depth adjustable range of the depth of the object is wide. When the area in which the amount of image shift difference is the positive value is large, since the area on which the sharpening process is performed is wide, it is difficult to visually recognize an effect having a variation in sharpening and smoothing and thus it is determined that the effect is small.

Also, the CPU 121 determines the magnitude of an effect for each partial area in an image using the fact that a magnitude of an absolute value of the image shift difference amount distribution also indicates a magnitude of contrast of an image area. When an area in which a value of the image shift difference amount distribution is a positive value and the value thereof is larger than a predetermined threshold value has a certain size or more, the area is determined to be the large effect area. Furthermore, when a negative value area is present around a positive value area in the image shift difference amount distribution, since the effect is greatly felt due to variations in the sharpening process and the smoothing process, the area is determined to be the large effect area.

At a time of determining a large effect area, an area to be sharpened and an area to be smoothened using depth correction may be separately detected. In other words, the user can easily select an area to be desired to be subjected to an image process by distinguishing and displaying a sharpened area and a smoothened area.

Although an image shift difference amount distribution is used as parallax-related information when determining a large effect area, other information may be used. For example, a contrast distribution, a contrast difference amount distribution, or the like can be used. A magnitude of a nigh frequency component of an image signal can be determined for each area from a contrast distribution. It is determined that a depth correction effect can be more easily obtained in an area in which high frequency components are many. Furthermore, in a contrast difference amount distribution, an area in which a difference of contrasts between different viewpoint images is large is inappropriate for image correction is some cases as described above. For this reason, it is determined that it is difficult to obtain a depth correction effect in an area in which a value of an amount of contrast difference is large.

Also, although an image shift difference amount distribution is calculated from an image shift amount distribution and a contrast distribution, a difference between an image shift amount distribution and a predetermined amount of image shift p may be used as parallax-related information. With regard to the predetermined amount of image shift p, it can be determined that an area in which an amount of image shift is large is outside of a depth correction range.

A process of determining an area in which an effect due to depth correction is large is performed for each predetermined amount of image shift, and a process of associating the determination result with the predetermined amount of image shift p and storing an area in which the effect is large (a large effect area) in a memory is performed. At that time, there is no a large effect area in some cases depending an F number or an ISO sensitivity regardless of a predetermined amount of image shift or an area in a screen. In this case, information on the absence of a large effect area is stored in the memory. After the end of Step S203, the sub-routine associated with the extract of the large effect area is completed.

Figure 26:
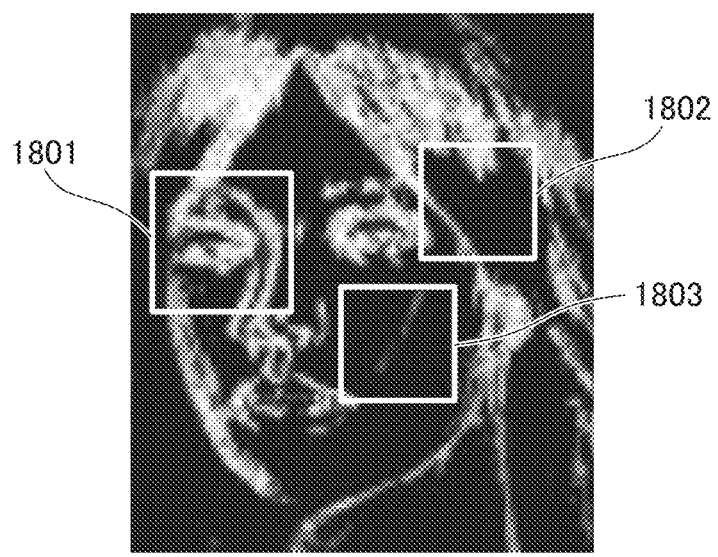
FIG. 26 is a schematic explanatory diagram illustrating an area having a large image processing effect of the embodiment.

A large effect area will be described using a specific example of FIG. 26. FIG. 26 is an enlarged diagram of a part (an area near a face) of the image shift difference amount distribution in FIG. 19. An area 1801 is an area in which a value of an image shift difference amount distribution is a positive value and an area having a large value is present over a predetermined range or more. For this reason, such an area is determined to be a large effect area. On the other hand, since an area 1803 is an area in which a value of a contrast distribution $M_{CON}(j,i)$ in the area is less than a predetermined value (for example, 0.2) and is excluded from the calculation of an amount of image shift, the area 1803 is an area in which a sharpening effect or a smoothing effect is not appear. For this reason, the area 1803 is determined to be an area in which the effect is small. Since an area 1802 is an area which has contrast on a side far from the eye area of the object, and in which an amount of image shift difference is not close to 0, the area 1802 is an area on which a smoothing process is performed. Although image correction using smoothing is performed on such an area, the area may be displayed as a large effect area.

Also, in order to extract a large effect area, the CPU 121 detects the face, eyes, or the like of the object and decides an area to be displayed by matching the object detection area and the large effect area. For example, when both of the face and the clothing of the object are detected as an area in which an image correction effect is large, since it is possible to perform, narrowing down to the face of the object from the object detection information, the user can easily select an area to be subjected to an image process.

In the embodiment, an example of a configuration in which the user selects an area for confirming depth information from an area candidate having a large depth correction effect and corrects an image has been described. A method of deciding image correction contents is not limited thereto. For example, the image processing apparatus may automatically select an area from an area candidate having a large effect of depth correction and perform image correction corresponding to such an area. At that time, for example, a process of preferentially correcting a face area of the object using known object, detection information is performed.

According to the embodiment, it is possible to easily recognize an area having a large effect in an image in a process of adjusting an effect of standing out the object area in the vicinity of an area in an in-focus state using comparison between the foreground and background in a blurred state after photographing. Thus, the image processing apparatus capable of easily selecting an appropriate image processing setting can be realized.

In the above description, the image process has been described by mainly exemplifying first and second viewpoint images acquired by the two photoelectric conversion units corresponding to one microlens in the imaging element. In the embodiment, of the imaging element having the four-divided photoelectric conversion unit illustrated in FIGS. 2B, 3C, and 3D, four viewpoint images are generated. In other words, a first viewpoint image to a fourth viewpoint image (a first viewpoint image to an $N_{LF}^{th}$ viewpoint image) serving as RGB signals of a Bayer array with predetermined resolution corresponding to specific pupil partial areas among first to fourth pupil partial areas of the image-forming optical system are generated. A captured image serving as an RGB signal of a Bayer array with predetermined resolution is generated by combining all of the signals of the first sub-pixel 201 to the fourth sub-pixel 204 for each pixel. With regard to the photoelectric conversion unit in each pixel unit of the imaging element, for example, an embodiment of Nx=3, Ny=3, and $N_{LF}$=9, Nx=4, Ny=4, and $N_{LF}$=16, or the like is possible by further increasing the number of divisions.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-252688, filed Dec. 27, 2016 which is hereby incorporated by reference wherein in its entirety.

What is claimed is:

1. An image processing apparatus comprising:
    at least one processor executing computer executable instructions or at least one circuit which functions as:
    an acquisition unit configured to acquire a plurality of viewpoint images having different viewpoint;
    a calculation unit configured to calculate associated information associated with parallax from the plurality of viewpoint images;
    an image processing unit configured to generate an output image by performing an image process on image data based on the plurality of viewpoint images;
    a setting unit configured to set the image process using the image processing unit; and
    a determination unit configured to acquire the associated information, determine an effect of the image process for each area in the output image, and output the determination result; and
    a display unit configured to display an image of a characteristic area determined by the determination unit that the effect of the image process is large, or both of the image of the characteristic area and the output image,
    wherein the image processing unit sets a parameter using the plurality of viewpoint images and the associated information, generates the output image, and outputs the generated output image to the display unit, and
    wherein the display unit distinguishes and displays the characteristic area for each degree of effect of an image process corresponding to the parameter or for each setting value of the parameter.

2. The image processing apparatus according to claim 1, wherein the image processing unit performs a process for combining the plurality of viewpoint images and generating the output image.

3. The image processing apparatus according to claim 1, wherein the associated information includes information calculated using at least One of an image shift amount distribution between the plurality of viewpoint images, a predetermined amount of signal of a spatial frequency band associated with the plurality of viewpoint images, and contrast of the plurality of viewpoint images.

4. The image processing apparatus according to claim 3, wherein the determination unit determines that an area in which an amount of image shift is smaller than a threshold value in the image shift amount distribution, an area in which the amount of signal is larger than a threshold value, or an area in which the contrast is larger than a threshold value is an area having a large effect of the image process.

5. The image processing apparatus according to claim 1, wherein the determination unit determines the effect of the image process by referring to a parameter used for setting of the image process.

6. The image processing apparatus according to claim 1, wherein the at least one processor executing the computer executable instructions or the at least one circuit further function as a decision unit configured to decide the output image from the characteristic area.

7. The image processing apparatus according to claim 1, wherein the at least one processor executing the computer executable instructions or the at least one circuit further function as:
    a detection unit configured to detect an object area in the output image; and
    a decision unit configured to decide an area of the output image from the object area and the characteristic area,
    wherein the display unit displays an area decided by the decision unit.

8. The image processing apparatus according to claim 7, wherein the display unit switches between a method of displaying a frame corresponding to the characteristic area and a method of displaying the area in units of pixels of the output image.

9. The image processing apparatus according to claim 8, wherein the display unit performs a display to notify that the characteristic area is unable to be obtained with respect to an output image for which the characteristic area is unable to be obtained.

10. The image processing apparatus according to claim 7, wherein the display unit changes the characteristic area to be displayed before and after content of the image process is decided.

11. The image processing apparatus according to claim 7, wherein the image processing unit subjects the plurality of viewpoint images to a sharpening or smoothing process before the image process.

12. The image processing apparatus according to claim 1, wherein the acquisition unit acquires the plurality of viewpoint images generated from pixel signals obtained by photoelectrically converting light passing through different pupil areas of an image-forming optical system using a plurality of photoelectric conversion units.

13. An imaging apparatus comprising:
the image processing apparatus according to claim 1; and
an imaging element configured to capture an object.

14. The imaging apparatus according to claim 13, wherein the imaging element includes plurality of microlenses and a plurality of photoelectric conversion units and each of the microlenses corresponds to the plurality of photoelectric conversion units, and
signals of the plurality of viewpoint images are generated from signals output from the plurality of photoelectric conversion units corresponding to each microlens.

15. An image processing method comprising:
acquiring a plurality of viewpoint images having different viewpoint;
setting an image process using an image processing unit;
calculating associated information associated with parallax from the plurality of viewpoint images;
generating an output image by performing, by the image processing unit, image processing on image data based on the plurality of viewpoint images;
acquiring the associated information, determining an effect of the image process for each area in the output image, and outputting the determination result;
displaying, by a display unit, an image of a characteristic area determined by determination unit that the effect of the image process is large, or both of the image of the characteristic area and the output image;
setting, by the image processing unit, a parameter using the plurality of viewpoint images and the associated information, generating the output image, and outputting the generated output image to the display unit; and
distinguishing and displaying, by the display unit, the characteristic area for each degree of effect of an image process corresponding to the parameter or for each setting value of the parameter.

16. A non-transitory readable storage medium which stores a program causing a computer to execute an image processing method, the method comprising:
acquiring a plurality of viewpoint images having different viewpoint;
setting an image process using an image processing unit;
calculating associated information associated with parallax from the plurality of viewpoint images;
generating an output image by performing, by the image processing unit, image processing on image data based on the plurality of viewpoint images;
acquiring the associated information, determining an effect of the image process for each area in the output image, and outputting the determination result;
displaying, by a display unit, an image of a characteristic area determined by a determination unit that the effect of the image process is large, or both of the image of the characteristic area and the output image;
setting, by the image processing unit, a parameter using the plurality of viewpoint images and the associated information, generating the output image, and outputting the generated output image to the display unit; and
distinguishing and displaying, by the display unit, the characteristic area for each degree of effect of an image process corresponding to the parameter or for each setting value of the parameter.

* * * * *